United States Patent
Kawakami et al.

(10) Patent No.: US 6,683,440 B2
(45) Date of Patent: Jan. 27, 2004

(54) DETECTING METHOD FOR DETECTING INTERNAL INFORMATION OF A RECHARGEABLE BATTERY, DETECTING APPARATUS FOR DETECTING INTERNAL INFORMATION OF A RECHARGEABLE BATTERY, APPARATUS IN WHICH SAID DETECTING METHOD IS APPLIED, APPARATUS INCLUDING SAID DETECTING APPARATUS, AND STORAGE MEDIUM IN WHICH A SOFTWARE PROGRAM OF SAID DETECTING METHOD IS STORED

(75) Inventors: Soichiro Kawakami, Nara-ken (JP); Yasusaburo Degura, Kyoto-fu (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/156,008

(22) Filed: May 29, 2002

(65) Prior Publication Data
US 2003/0006735 A1 Jan. 9, 2003

(30) Foreign Application Priority Data
May 29, 2001 (JP) ........................................ 2001-160568
May 29, 2002 (JP) ........................................ 2002-155038

(51) Int. Cl.⁷ ........................ H01M 10/44; H01M 10/46
(52) U.S. Cl. ...................................................... 320/133
(58) Field of Search ................................ 320/132, 133, 320/134, 136, 149, 155, 157, 160, 162, 164, 125

(56) References Cited
U.S. PATENT DOCUMENTS

| 5,105,294 A | 4/1992 | Degura et al. ............... 359/154 |
| 5,113,278 A | 5/1992 | Degura et al. ............... 359/154 |
| 5,264,955 A | 11/1993 | Sakanaka et al. ........... 359/152 |
| 5,744,936 A | 4/1998 | Kawakami ................... 320/120 |
| 5,795,679 A | 8/1998 | Kawakami et al. ......... 429/218 |
| 5,853,914 A | 12/1998 | Kawakami ................... 429/66 |
| 5,888,670 A | 3/1999 | Kawakami ............... 429/231.4 |
| 5,994,877 A | 11/1999 | Seri et al. .................... 320/132 |

FOREIGN PATENT DOCUMENTS

| JP | 4-2066 | 1/1992 |
| JP | 4-136774 | 5/1992 |
| JP | 9-134742 | 5/1997 |
| JP | 11-16607 | 1/1999 |
| JP | 11-271408 | 10/1999 |

Primary Examiner—Edward H Tso
(74) Attorney, Agent, or Firm—Fitzpatrick, Cella, Harper & Scinto

(57) ABSTRACT

A detecting method for detecting internal information of an inspective rechargeable battery when said inspective rechargeable battery is charged by a constant current-constant voltage charging regime, comprising at least a step (A) of measuring an elapse of time (t) from the time when a constant current charging mode at a constant current value $I_0$ is shifted to a constant voltage charging mode at a constant voltage $V_{max}$ and measuring a charge current value I in the constant voltage charging mode, a step (B) of obtaining a period of time from said shift time to the constant voltage charging in the constant voltage charging mode until the time when said charge current value $I_0$ in the constant voltage charging mode reaches a given current value $I_M$, and a step (C) of obtaining an electricity quantity charged in the constant voltage charging mode with respect to the inspective rechargeable battery.

45 Claims, 14 Drawing Sheets

FIG. 3 (1)
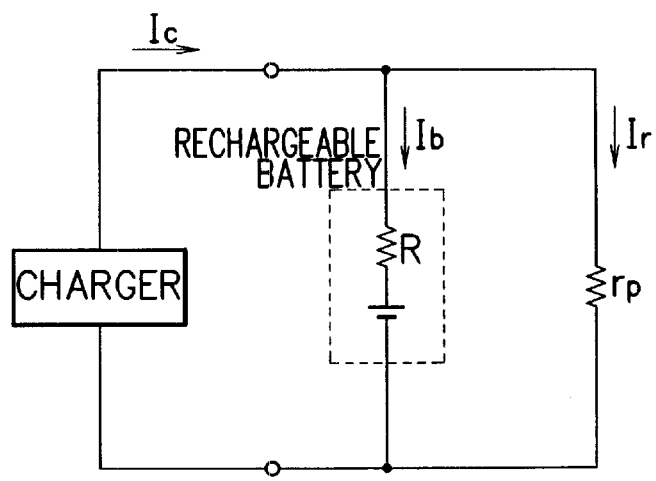
FIG. 3 (2)
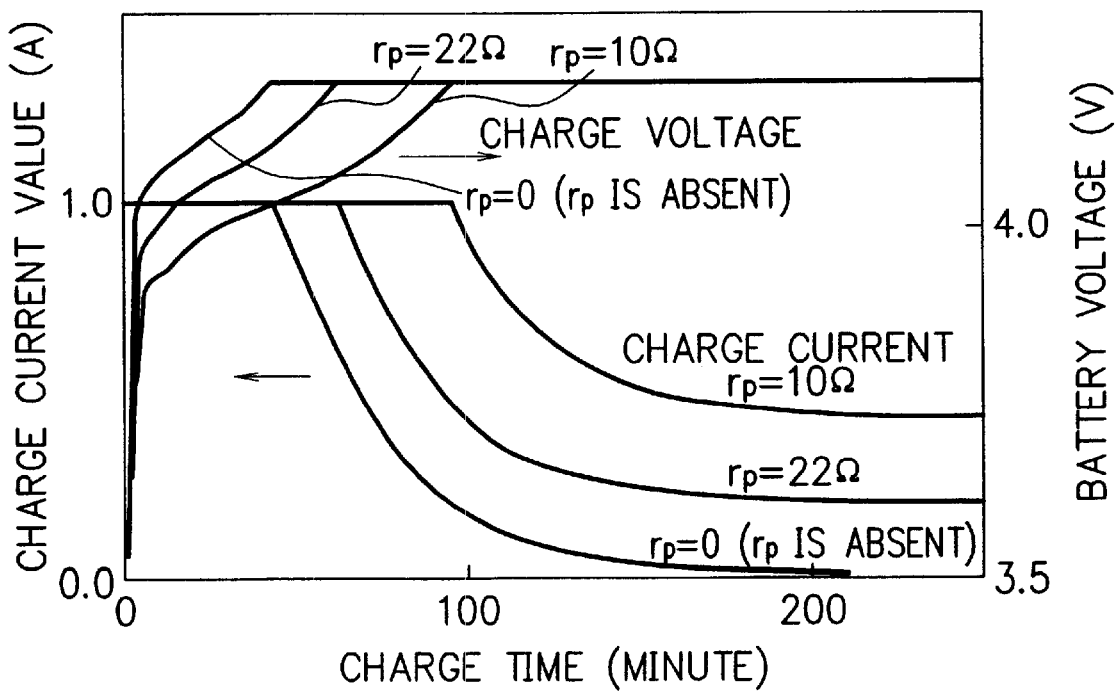

FIG. 4 (1)
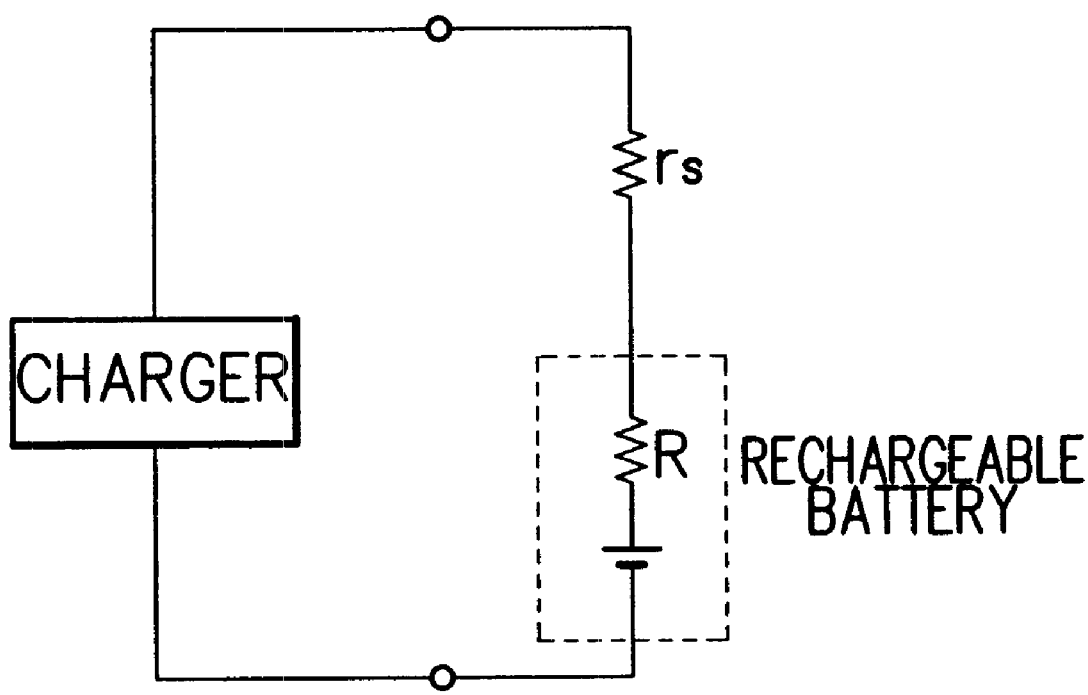

FIG. 4 (2)
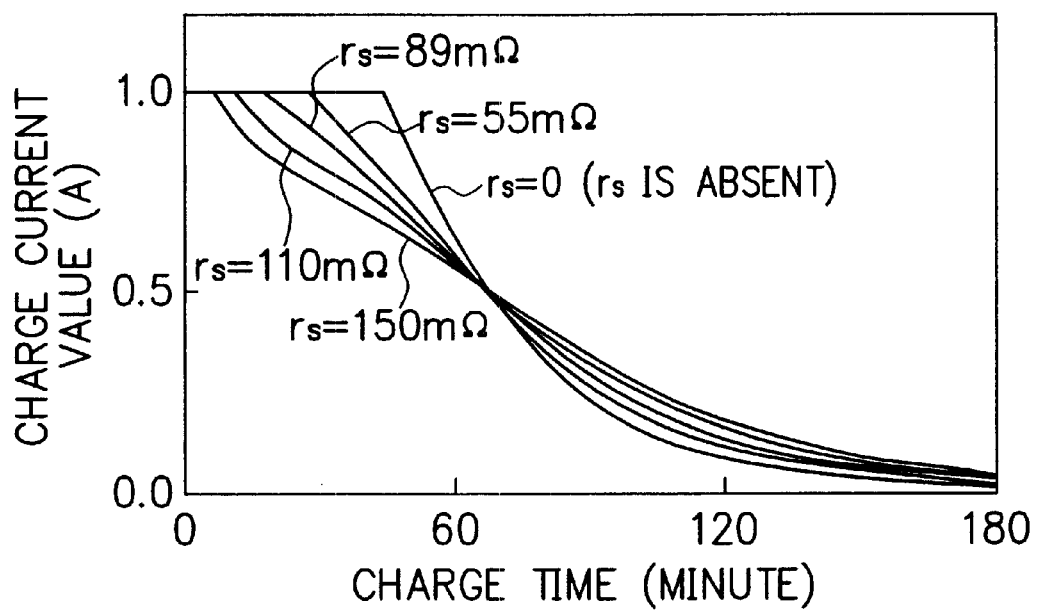
FIG. 4 (3)
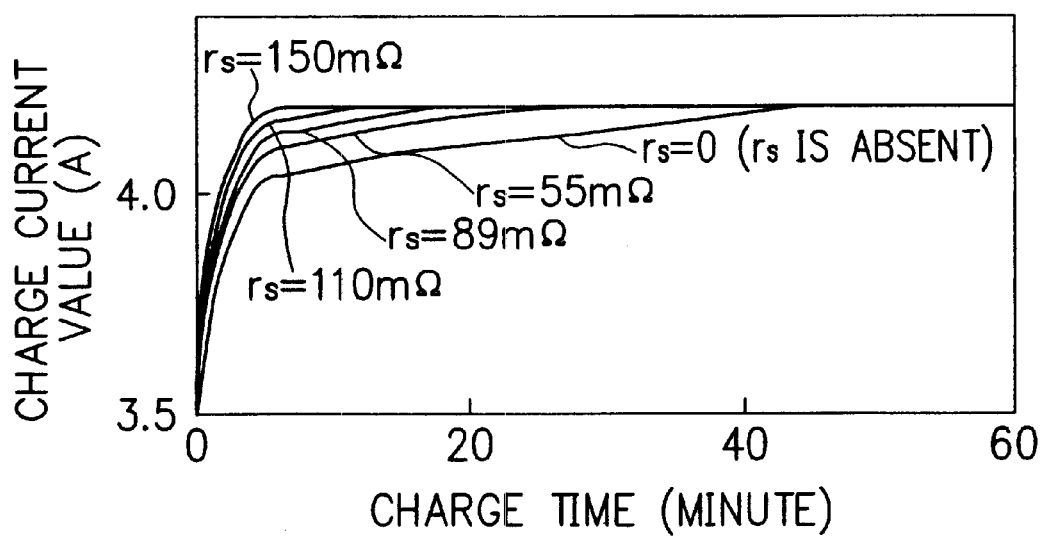

F I G. 5 (1)
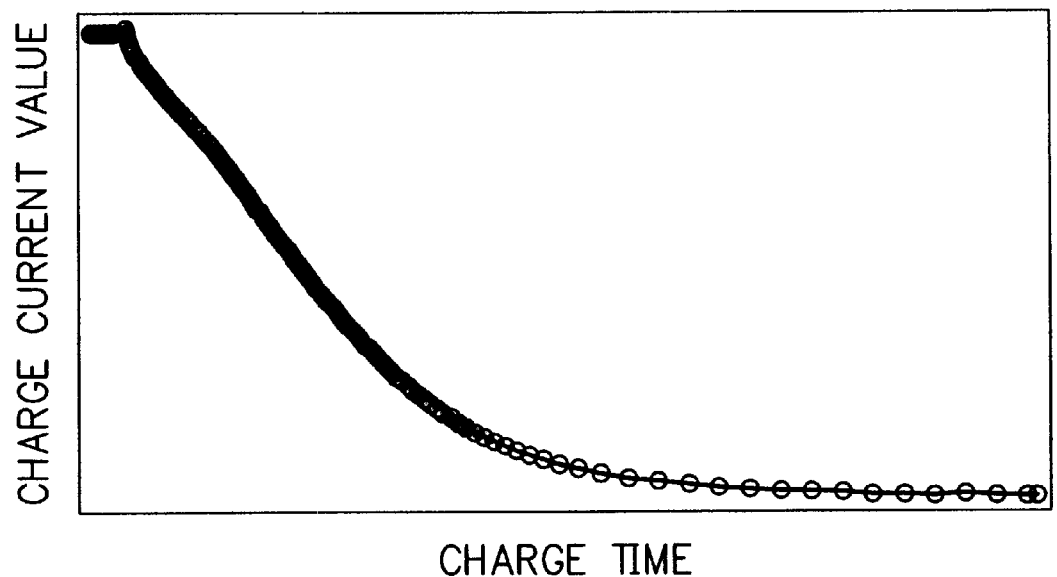
F I G. 5 (2)
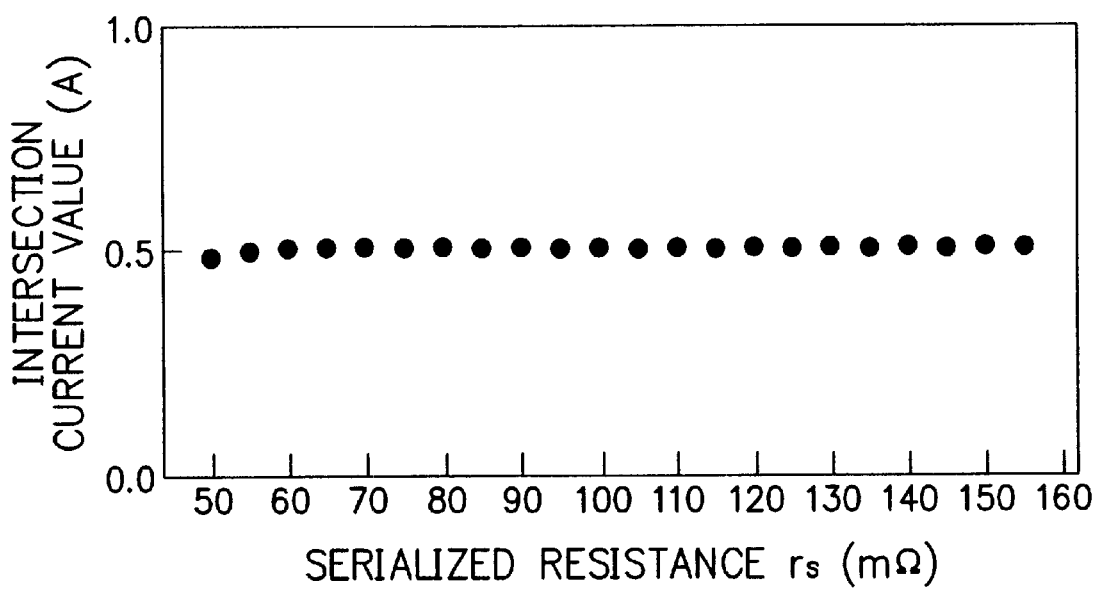

FIG. 6 (1)
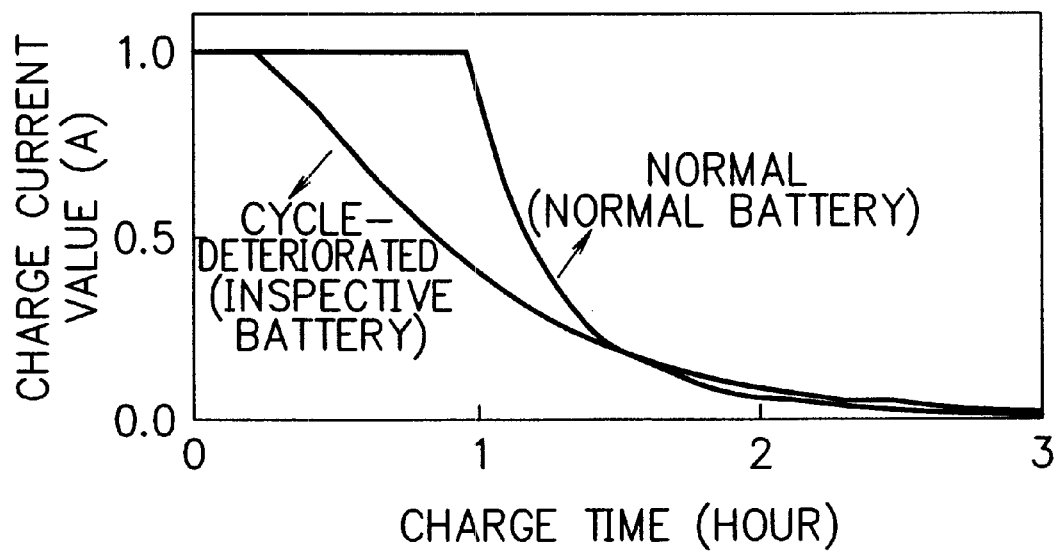
FIG. 6 (2)
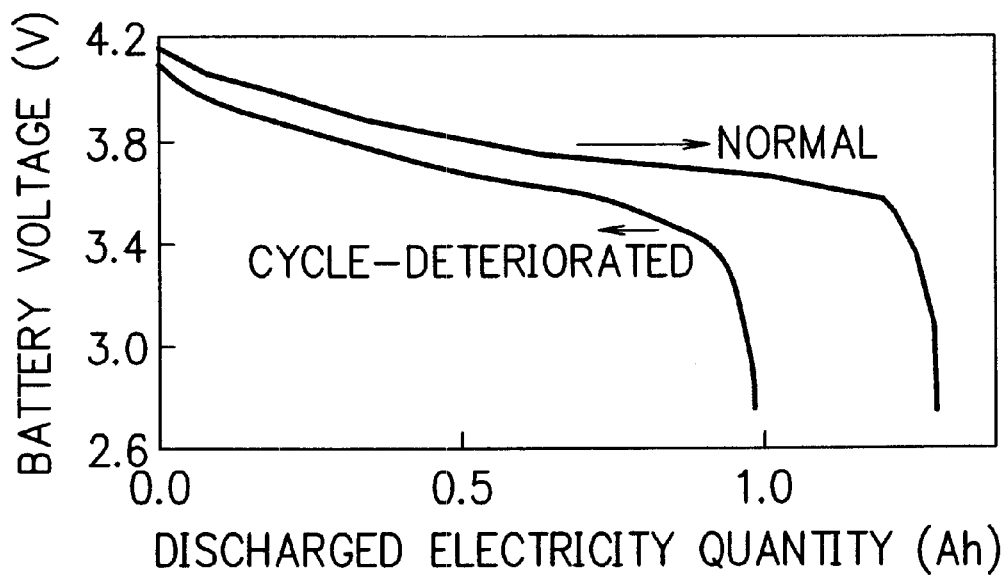

F I G. 6 (3)
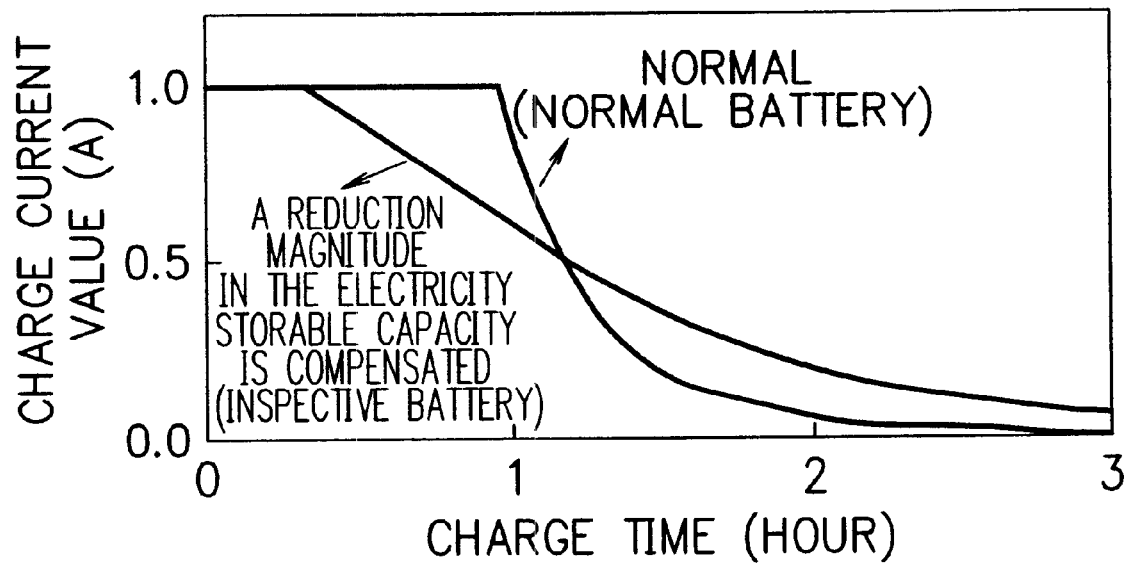

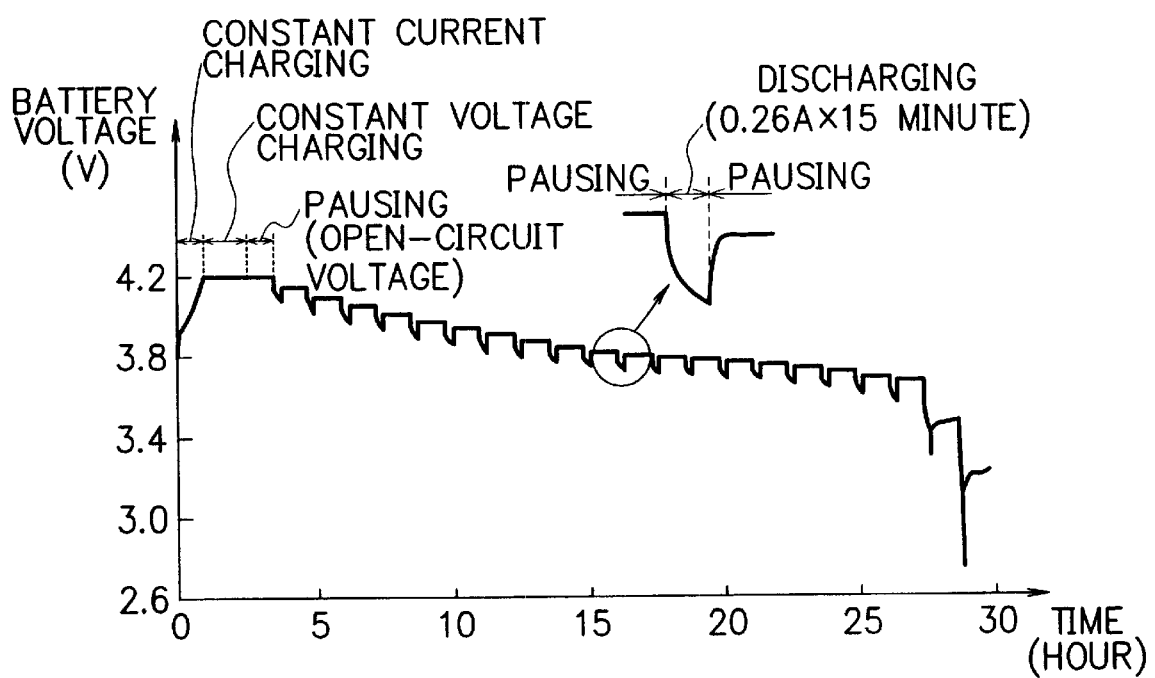
F I G. 9

FIG. 12 (1)
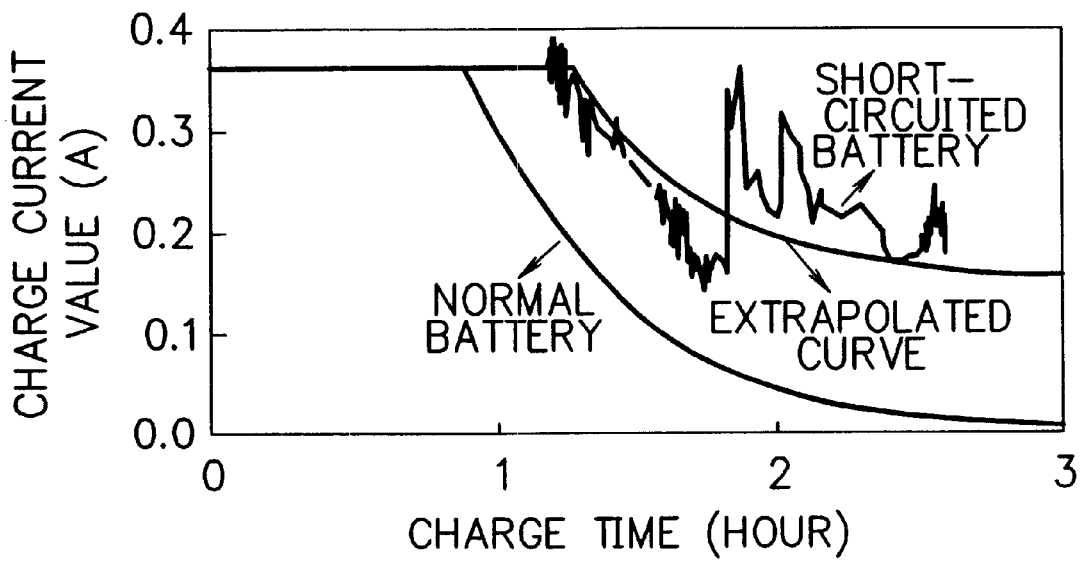
FIG. 12 (2)
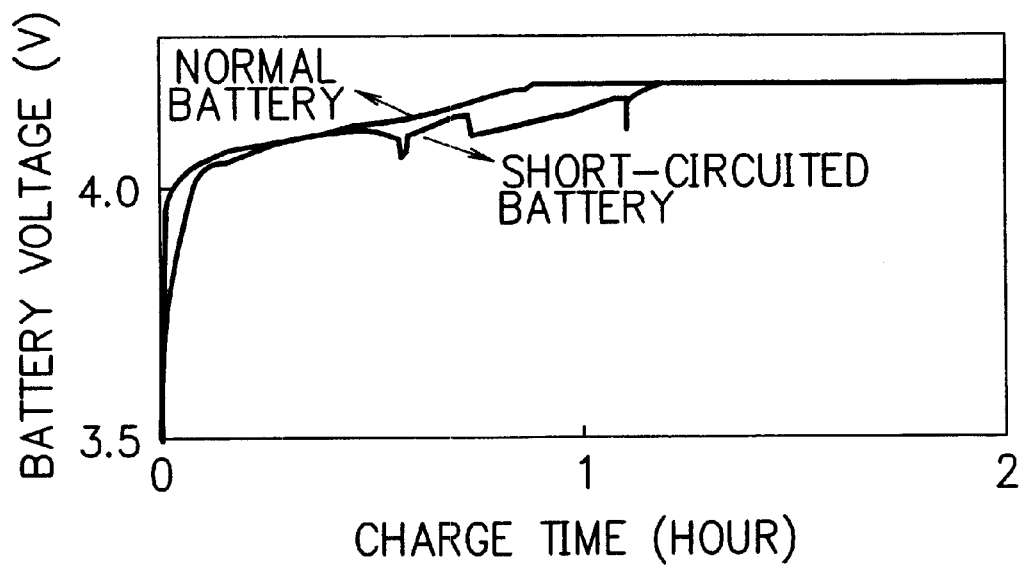

FIG. 12 (3)
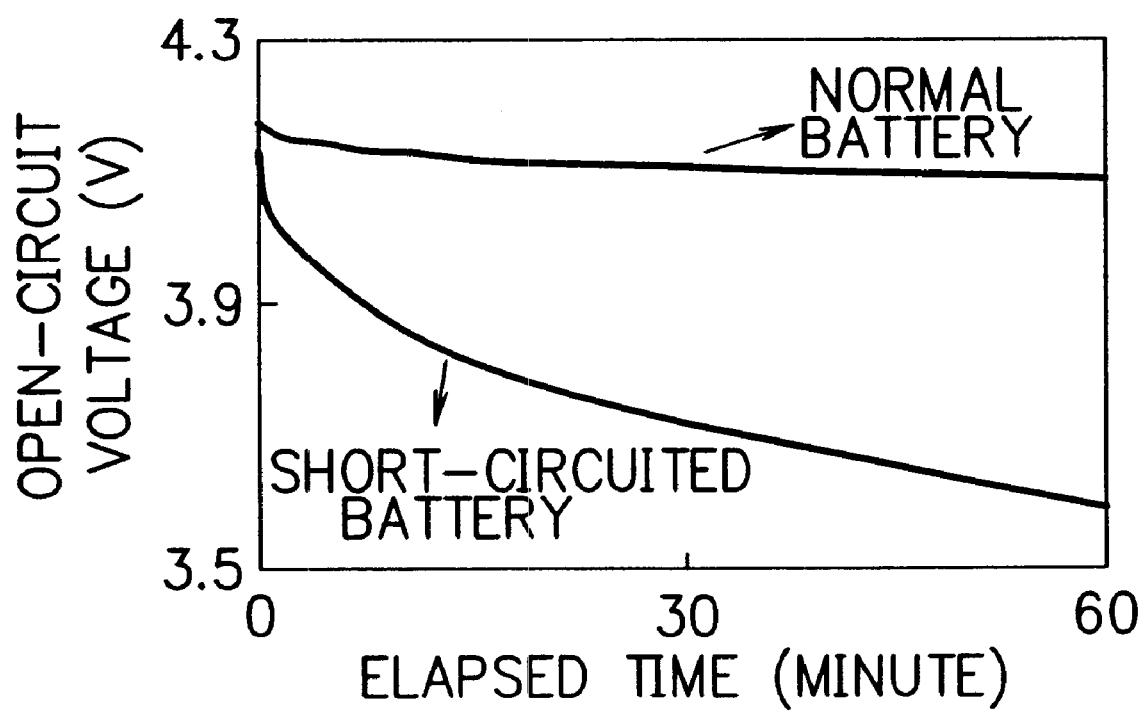

DETECTING METHOD FOR DETECTING INTERNAL INFORMATION OF A RECHARGEABLE BATTERY, DETECTING APPARATUS FOR DETECTING INTERNAL INFORMATION OF A RECHARGEABLE BATTERY, APPARATUS IN WHICH SAID DETECTING METHOD IS APPLIED, APPARATUS INCLUDING SAID DETECTING APPARATUS, AND STORAGE MEDIUM IN WHICH A SOFTWARE PROGRAM OF SAID DETECTING METHOD IS STORED

BACKGROUND OF THE INVENTION

1. Field of the Invention

The present invention relates to a detecting method for detecting internal information of a rechargeable battery to be inspected (this rechargeable battery will be hereinafter referred to as "inspective rechargeable battery") and a detecting apparatus for detecting internal information of an inspective rechargeable battery. The present invention also relates to an apparatus in which said detecting method is applied and an apparatus including said detecting apparatus. The present invention includes a storage medium in which a software of said detecting method is stored.

The internal information to be detected in the present invention includes the presence or absence of short circuit, electricity storable capacity, remaining capacity (=presently stored electricity quantity=dischargeable capacity), usable capacity (=presently residual electricity quantity which is still able to operate an instrument), internal resistance, and the like, of an inspective rechargeable battery.

2. Related Background Art

In recent years, along with development of semiconductor elements and development of miniature, light-weight and high performance rechargeable batteries, mobile instruments such as portable personal computers, video cameras, digital cameras, cellular phones, and personal digital assistants including palmtop PCs have been rapidly progressed.

Separately, in recent years, the global warming of the earth because of the so-called greenhouse effect to an increase in the content of $CO_2$ gas in the air has been predicted. For instance, in thermal electric power plants, thermal energy obtained by burning a fossil fuel is converted into electric energy, and along with burning of such fossil fuel, a large amount of $CO_2$ gas is exhausted in the air. Accordingly, in order to suppress this situation, there is a tendency of prohibiting to newly establish a thermal electric power plant. Under these circumstances, so-called load leveling practice has been proposed in order to effectively utilize electric powers generated by power generators in thermal electric power plants or the like, wherein using a load conditioner having a rechargeable battery installed therein, a surplus power unused in the night is stored in rechargeable batteries installed at general houses and the power thus stored is used in the daytime when the demand for power is increased, whereby the power consumption is leveled.

Separately, in recent years, electric vehicles comprising a rechargeable battery and which do not exhaust any polluting substances have been proposed. Besides hybrid powered automobiles in which a combination of a rechargeable battery and an internal combustion engine or a fuel cell is used and the fuel efficiency is heightened while restraining exhaustion of polluting substances have been also proposed. As the rechargeable battery used in these electric vehicles and hybrid powered automobiles, a high performance rechargeable battery having a high energy density is expected to be developed.

Such rechargeable battery presently used in the mobile instrument, the load conditioner used for practicing the load leveling, the electric vehicle and the hybrid powered automobile includes typically rechargeable lithium batteries (lithium ion rechargeable batteries) in which reduction-oxidation reaction of lithium is used.

Incidentally, in the mobile instrument, the load conditioner in the load leveling, the electric vehicle and the hybrid powered automobile in which such rechargeable battery as above mentioned is used, it is possible to extend the operation time to the maximum by properly controlling the power outputted from the rechargeable battery depending on internal information of the battery on the side of the apparatus in which the battery is accommodated, or it is possible to avoid occurrence of sudden stall of the operation by previously knowing the time necessary to exchange the battery by way of acquisition of information of the lifetime of the battery in advance.

Particularly, in order to prevent the operation of the mobile instrument, the load conditioner, the electric vehicle or the hybrid powered automobile from being suddenly stopped, it is very important to be able to precisely detecting internal information of the rechargeable battery used therein, represented by electricity storable capacity, remaining capacity (=presently stored electricity quantity= dischargeable capacity), usable capacity (=presently residual electricity quantity which is still able to operate an instrument), and internal resistance of the battery.

In order to detect the remaining capacity of a rechargeable battery, there is known a method wherein the voltage of the battery is measured and based on the measured battery voltage, the usable capacity is estimated.

The term "remaining capacity" of the rechargeable battery means a presently stored electricity quantity of the battery which can be discharged. The term "usable capacity" means a presently available electricity quantity of the rechargeable battery with which an instrument (or an apparatus) having said rechargeable battery can be still operated. The usable capacity is included in the term remaining capacity.

Aforesaid method is applicable in the case of a lithium ion rechargeable battery whose anode material comprising a non-graphitizing carbon material which is distinguished from a graphite, where because the battery voltage is gradually decreased in proportion to the quantity of the electricity to be discharged, and therefore, the usable capacity of the rechargeable battery can be estimated by measuring the battery voltage. However, it is difficult to precisely detect the remaining capacity of the rechargeable battery by using this method because the battery voltage differs depending on an electric current flown even when the remaining capacity is identical. Besides, in the case where the performance of the rechargeable battery has been deteriorated to close its lifetime, it is extremely difficult to precisely detect the remaining capacity.

Separately, in the case of a lithium ion rechargeable battery whose anode material comprising a graphite series carbonous material, because the battery voltage with respect to the quantity of the electricity to be discharged is flat, it is difficult to estimate the remaining capacity from the battery voltage in accordance with aforesaid method.

There is also known a method in order to detect the remaining capacity of a rechargeable battery, wherein an accumulation discharged-electricity quantity is memorized and the accumulation discharged-electricity quantity is subtracted from a charged-electricity quantity to obtain a remaining capacity thereof. However, this method has such disadvantages as will be described in the following. That is, the current value and the discharge time are necessary to be always memorized. Besides, in the case where the discharge depth of the rechargeable battery is unknown with respect to the discharge depth and additional charging is performed for this rechargeable battery, although the charged-electricity quantity at that time can be detected, the remaining capacity of the rechargeable battery after the rechargeable battery is subjected to charging cannot be precisely detected because the remaining capacity of the rechargeable battery before the additional charging is unknown. When aforesaid method is adopted in this case, because the method is of a way to calculate a remaining capacity by subtracting the total discharged-electricity quantity from the accumulation charged-electricity quantity prior to the discharging, a large error is likely to occur in the measurement.

Therefore, the method is difficult to cope with a rechargeable battery whose performance has been deteriorated to close its lifetime, where it is difficult to precisely detect the remaining capacity.

Now, Japanese Laid-open Patent Publication No. Hei.4 (1992)-2066 (hereinafter referred to as document 1) discloses a method for distinguishing the capacity of a lead battery in accordance with recovery characteristic of the battery voltage after pulse discharge.

Japanese Laid-open Patent Publication No. Hei.4(1992)-136774 (hereinafter referred to as document 2) discloses a method wherein for a rechargeable battery, when the power source is ON, discharging is temporarily performed at a large current to detect a decrease in the battery voltage, the detected decrease value is compared with a prejudged battery voltage value, where when the difference is great, the residual capacity is judged to be insufficient.

Japanese Laid-open Patent Publication No. Hei.11(1999)-16607 (hereinafter referred to as document 3) discloses a method wherein for a rechargeable battery, the battery voltage when a prescribed current is applied for a prescribed period of time is measured and the measured battery voltage is collated with a previously established battery voltage-residual capacity corresponding table to estimate a residual capacity of the battery.

However, for a rechargeable battery whose performance has been deteriorated to increase the internal resistance or to decrease the electricity storable capacity, any of the methods disclosed in documents 1 to 3 is difficult to precisely detect the remaining capacity of the battery.

Separately, Japanese Laid-open Patent Publication No. Hei.9(1997)-134742 (hereinafter referred to as document 4) discloses a method wherein for a rechargeable battery, the internal impedance directly before reaching the discharge termination voltage is measured by an impedance-measuring instrument while flowing an alternate current to determine whether or not the rechargeable battery is deteriorated with respect its performance.

However, the method disclosed in document 4 is not practically applicable for the reason that such impedance-measuring instrument for measuring the impedance is required to have an alternate current-generating circuit and because of this, the apparatus involved unavoidably becomes large-sized, and in addition, during when the rechargeable battery is operated, the measurement cannot be performed.

Further, Japanese Laid-open Patent Publication No. Hei.11(1999)-271408 (hereinafter referred to as document 5) discloses a method to detect a degraded battery wherein a rechargeable battery (a lithium ion rechargeable battery) is charged by a constant current-constant voltage with a taper charge (CCCV) regime (this will be hereinafter referred to as "constant current-constant voltage charging regime" or "CCCV charging regime") [wherein charging is commenced at a constant current value and after the battery voltage reaches a given voltage value, the charging is performed at a constant voltage until the termination thereof]. This method is of a way to estimate a deterioration magnitude of the battery from the charged electricity quantity at a constant current, a current drop immediately after the constant current charging is switched to the constant voltage charging, and a current drop rate at the constant voltage charging.

However, the method disclosed in document 5 yet has not reached such a stage that internal information relating to the remaining capacity of the rechargeable battery can be always stably obtained from the charged electricity quantity at the time of the constant current charging and the current drop or the current change rate at the constant voltage charging. Separately, document 5 describes that the remaining capacity when the battery is deteriorated, the charged electricity quantity at the time of the constant current charging, the current drop rate at the time of the constant voltage charging, and the current change drop at the constant voltage charging are correlated. However document 5 does not mention even a suggestion that which factors are the most correlated, what is a reliable method in order to detect the remaining capacity, and specifically, how the remaining capacity is detected. Further, in accordance with the description of Document 5, it is impossible to distinguish whether or not the remaining capacity is decreased when the battery is short-circuited, whether or not the remaining capacity is decreased when the battery is deteriorated to increase the internal resistance, or whether or not the remaining capacity itself is decreased, and therefore, it is impossible to grasp details of a deteriorated state of the battery. Information of whether or not the battery is short-circuited is important not only in order to more safely use the battery but also in order to accurately grasp internal information of the battery.

Incidentally, for a rechargeable battery, when the charge-and-discharge operation is repeated, there is a tendency in that the internal resistance is increased to decrease the charge capacity due to a cause that the electrode active material is deteriorated, the electrode active material is peeled or missed from the collector, or the electrolyte solution is decomposed. Besides, when the connection portions of the leads connecting to the output terminals extending from the battery should be peeled due to a certain case such as vibration or the like, there will be an occasion in that the internal resistance of the battery is increased. In addition, there will be an occasion in that due to a metal deposition or the like by way of electrochemical reaction, a short-circuited portion is occurred between the anode and the cathode and as a result, the internal resistance is decreased while the remaining capacity is decreased.

For such rechargeable battery in which the internal resistance is increased, the remaining capacity is decreased or which is short-circuited, in the case where internal information thereof is intended to detect by the conventional method, it is difficult to avoid occurrence of a large error in terms of the accuracy.

In this respect, there is an increased demand for providing a detecting method and a detecting apparatus which enable one to precisely detect an usable capacity (that is, a presently residual electricity quantity which is still able to operate an instrument) of any of various rechargeable batteries even when they are such that their remaining capacity is decreased or their internal resistance is increased and their performance is deteriorated. Besides, a detecting method and a detecting apparatus which are applicable in any rechargeable batteries in order to precisely detect their lifetime, i.e., deterioration of their performance are expected to be developed.

SUMMARY OF THE INVENTION

The present invention is aimed at solving the shortcomings in the prior art in that in any of the proposed methods for detecting internal information of a rechargeable battery, represented by the electricity storable capacity and the like, is inferior in terms of the detection accuracy.

Another object of the present invention is to provide a detecting method and a detecting apparatus which enable one to detect internal information of any rechargeable battery at a high precision even when the rechargeable battery is a rechargeable battery whose performance is deteriorated.

A further object of the present invention is to provide an instrument in which said detecting method or said detecting apparatus is applied.

A still further object of the present invention is to provide a storage medium in which a software program of said detecting method is stored.

A typical embodiment of the detecting method of the present invention is a detecting method for detecting internal information of a rechargeable battery to be inspected (this rechargeable battery will be hereinafter referred to as inspective rechargeable battery) when said inspective rechargeable battery is charged by a constant current-constant voltage charging regime in that charging is commenced at a constant current value $I_0$ and after the battery voltage reaches a given voltage value $V_{max}$, the charging is performed at a constant voltage $V_{max}$ until the termination thereof, said detecting method is characterized by comprising at least a step (A) of measuring an elapse of time (t) from the time when a constant current charging mode at a constant current value $I_0$ is shifted to a constant voltage charging mode at a constant voltage $V_{max}$ and measuring a charge current value I in the constant voltage charging mode, a step (B) of obtaining a period of time from said shift time to the constant voltage charging until the time when said charge current value I in the constant voltage charging mode reaches a given current value $I_M$, and a step (C) of obtaining a charged electricity quantity of the inspective rechargeable battery in the constant voltage charging mode.

The detecting method may include a step (D) of referring to charge current characteristics of a corresponding normal rechargeable battery as a reference standard of the inspective rechargeable battery in the constant voltage charging mode when said normal rechargeable battery is charged by the constant current-constant voltage charging regime.

The internal information of the inspective rechargeable battery which is acquired by the detecting method of the present invention includes facts about. According to the detecting method of the present invention, even when the inspective rechargeable battery is a rechargeable battery whose discharge depth before the commencement of charging is unknown, to be more specific, even when additional charging is performed for an inspective rechargeable battery in which a certain quantity of electricity is still remained, internal information thereof represented by the remaining capacity can be acquired.

A typical embodiment of the detecting apparatus of the present invention is a detecting apparatus for detecting internal information of an inspective rechargeable battery when said inspective rechargeable battery is charged by a constant current-constant voltage charging regime in that charging is commenced at a constant current value $I_0$ and after the battery voltage reaches a given voltage value $V_{max}$, the charging is performed at a constant voltage $V_{max}$ until the termination thereof, said detecting apparatus having at least a means for measuring a charge current value I when the inspective rechargeable battery is charged by the constant current-constant voltage charging regime; a means for measuring an elapse of time (t) from the time when a constant current charging mode at a constant current value $I_0$ is shifted to a constant voltage charging mode at a constant voltage $V_{max}$; a means for measuring a time ($t_M'$) when the charge current value in said constant voltage charging mode becomes to be a given current value $I_M$; a means for measuring a charged electricity quantity $Q_{vc}'$ in said constant voltage charging mode; a memory means in which an electricity storable capacity (or a nominal capacity) $C_N$ of a corresponding normal rechargeable battery and internal information of said normal rechargeable battery when said normal rechargeable battery is charged by the constant current-constant voltage charging regime are memorized, said internal information including the time ($t_M$) when the charge current value in the constant voltage charging mode becomes to be a given current value $I_M$ and the charged electricity quantity $Q_{CV}$ in the constant voltage charging mode; and an arithmetic means for computing an electricity storable capacity ($C_N'$) of the inspective rechargeable battery from said $C_N$, $t_M$ and $Q_{VC}$ of the normal rechargeable battery which are memorized in said memory means and said $t_M'$ and $Q_{VC}'$ detected from the inspective rechargeable battery.

BRIEF DESCRIPTION OF THE DRAWINGS

FIG. 3(1) is a schematic diagram of a circuit in which a resistor is connected to a normal rechargeable battery (which is not short-circuited) in parallel connection to make the rechargeable battery into a short-circuited rechargeable battery model and a charger is connected to the rechargeable battery.

FIG. 3(2) shows an example of a graph exemplifying curves of changes in the charge voltage (=battery voltage) and the charge current to charge time of the rechargeable battery shown in FIG. 3(1) when the rechargeable battery has charged by a constant current-constant voltage charging regime and wherein the resistance value of the resistor has changed.

FIG. 4(1) is a schematic diagram of a circuit in which a resistor is connected to a normal rechargeable battery (which is not short-circuited) in series connection to make the rechargeable battery into a rechargeable battery model with an increased internal resistance and a charger is connected to the rechargeable battery.

FIG. 4(2) shows an example of a graph exemplifying curves of changes in the charge current to charge time of the rechargeable battery shown in FIG. 4(1) when the rechargeable battery has charged by a constant current-constant voltage charging regime and wherein the resistance value of the resistor has changed.

FIG. 4(3) shows an example of a graph exemplifying curves of changes in the charge voltage (=battery voltage) to charge time of the rechargeable battery shown in FIG. 4(1) when the rechargeable battery has charged by the constant current-constant voltage charging regime and wherein the resistance value of the resistor has changed.

FIG. 5(1) shows a graph of a normal rechargeable battery when charged by a constant current-constant voltage charging regime, exemplifying agreement of measured values of changes in the charge current with an elapse of charge time, with a charge current curve by a function formula obtained from curve fittings of said measured values.

FIG. 5(2) shows a graph of (a) a normal rechargeable battery having a resistor connected thereto in series connection [see, FIG. 4(1)] and (b) another normal rechargeable battery having no resistor connected thereto when each of the two rechargeable batteries has charged by a constant current-constant voltage charging regime wherein the resistance value of the resistor of the rechargeable battery (a) has varied, wherein current values at intersections of two charge current curves of the rechargeable batteries (a) and (b) which are obtained from the function formula of charge current with respect to the resistance value.

FIG. 6(1) shows a graph exemplifying charge current changes (or profiles) to charge time changes of each of (a) a normal rechargeable battery and (b) a cycle-deteriorated rechargeable battery when each of them has charged by a constant current-constant voltage charging regime.

FIG. 6(2) shows a graph of each of the rechargeable batteries (a) and (b) charged as described in FIG. 6(1), exemplifying battery voltage changes to changes in the discharged electricity quantity when each of the rechargeable batteries (a) and (b) has discharged at a constant current.

FIG. 6(3) shows a graph exemplifying a charge current curve of the cycle-deteriorated rechargeable battery (b) whose remaining capacity has decreased in the case shown in FIG. 6(1) when a decreased quantity of the electricity storable capacity of the cycle-deteriorated rechargeable battery (b) has compensated to be substantially the same as the electricity storable capacity of the normal rechargeable battery (a).

FIG. 9 shows a graph exemplifying changes in the battery voltage of a rechargeable battery when the rechargeable battery was charged by a constant current-constant voltage charging regime and thereafter, a cycle of discharging the rechargeable battery and pausing the discharging operation was repeated.

FIG. 12(1) is a graph of (a) a normal rechargeable battery and (b) a short-circuited rechargeable battery when each of the two rechargeable batteries (a) and (b) has charged by a constant current-constant voltage charging regime, exemplifying an example of a relationship of changes in the charge current to charge time changes for the two rechargeable batteries (a) and (b).

FIG. 12(2) is a graph of (a) a normal rechargeable battery and (b) a short-circuited rechargeable battery when each of the two rechargeable batteries (a) and (b) has charged by a constant current-constant voltage charging regime, exemplifying an example of a relationship of changes in the battery voltage to charge time changes for the two rechargeable batteries (a) and (b).

FIG. 12(3) is a graph of (a) a normal rechargeable battery and (b) a short-circuited rechargeable battery when each of the two rechargeable batteries (a) and (b) has charged by a constant current-constant voltage charging regime and maintained in a paused state without performing the charging operation and the discharging operation, exemplifying an example of a relationship of changes in the open-circuit voltage to an elapsed time of the paused state for the two rechargeable batteries (a) and (b).

DESCRIPTION OF THE INVENTION AND PREFERRED EMBODIMENTS

Figure 1:
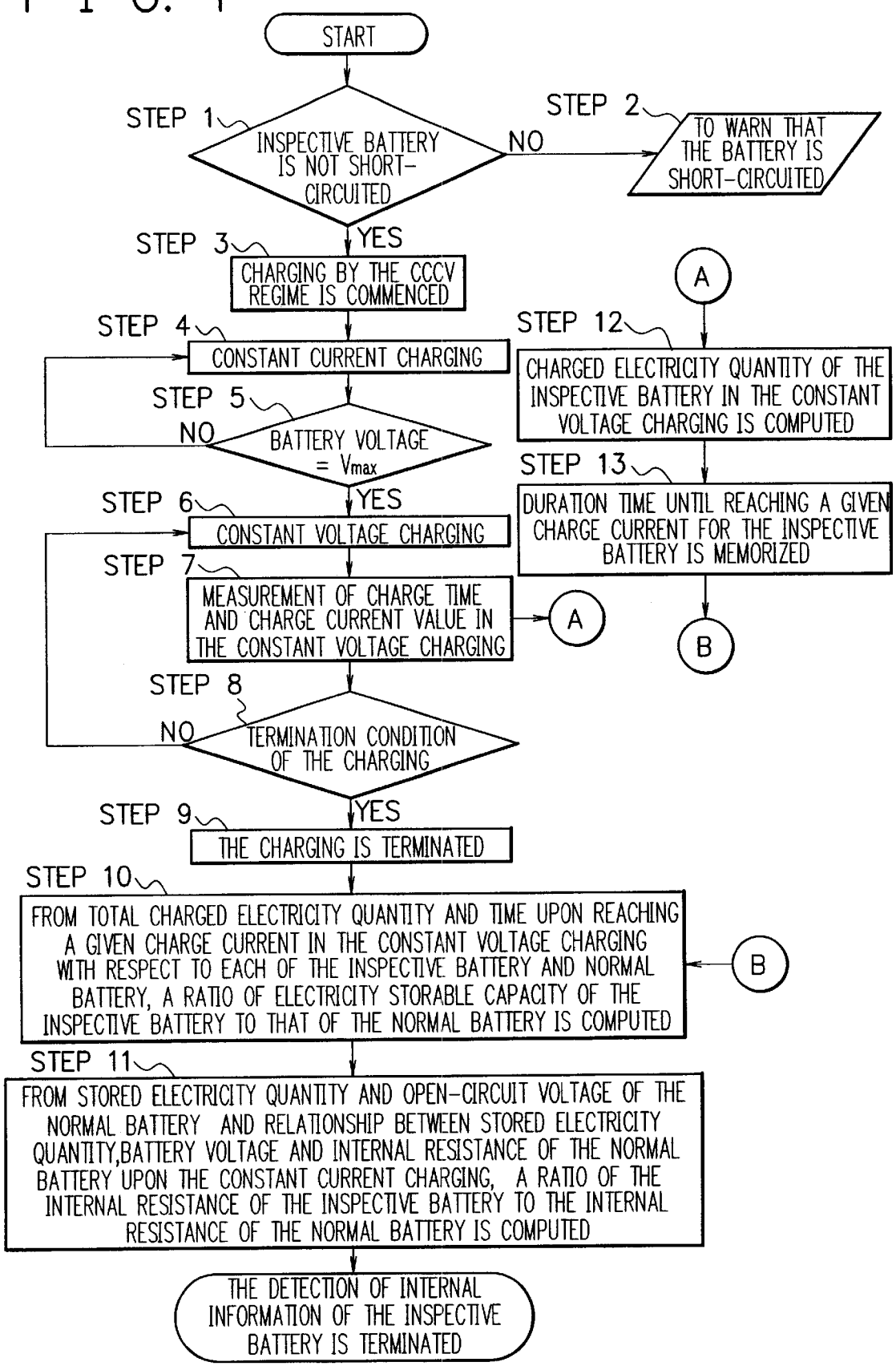
FIG. 1 shows a flow chart illustrating an embodiment of a detecting method for detecting internal information of a rechargeable battery in the present invention.

In order to achieve the foregoing objects of the present invention while solving the shortcomings in the prior art, the present inventors performed experimental studies. As a result, there were obtained findings as will be described below.

That is, in the case where a rechargeable battery to be inspected (hereinafter referred to as "inspective rechargeable battery") is charged by a constant current-constant voltage charging regime in that charging is commenced at a constant current value and after the battery voltage reaches a given voltage, the charging is performed at a constant voltage until the termination thereof, when said inspective rechargeable battery is a rechargeable battery whose internal resistance has been increased, notwithstanding a magnitude of an increase in the internal resistance, the charge current curve thereof in the constant voltage charging region intersects with that of a corresponding normal rechargeable battery when charged by the constant current-constant voltage charging regime at a certain charge current value $I_M$. Therefore, in the case where the inspective rechargeable battery is not short-circuited, by measuring a time until the time when the charge current in the constant voltage charging mode reaches a certain charge current value $I_M$, it is possible to obtain internal information of the inspective rechargeable battery which concerns the electricity storable capacity of the battery, and it is possible to judge whether or not short-circuiting is present in the inspective rechargeable battery in accordance with a converged value of the charge currents of the inspective rechargeable battery and the normal rechargeable battery in the constant voltage charging mode. Further from the determination of the electricity storable capacity, it is possible to obtain internal information of the inspective rechargeable battery which concerns the internal resistance thereof.

Incidentally, unless otherwise specified, the term "constant voltage charging mode" in the description is an expression indicating a state wherein a rechargeable battery is being charged at a constant voltage or a case wherein a rechargeable battery is being charged at a constant voltage from the side of a non-controlled computer program. However, when observed from the rechargeable battery side, the "constant voltage charging mode" is the same meaning as that of the "state wherein a rechargeable is charged at a constant voltage" or the "case wherein a rechargeable is charged at a constant voltage". On the other hand, the term "constant current charging mode" means a state or a case wherein a rechargeable battery is being charged at a constant current value".

The present invention has been accomplished on the basis of the above findings.

Thus, as previously described, the present invention provides a detecting method for detecting internal information of an inspective rechargeable battery when said inspective rechargeable battery is charged by the constant current-constant voltage charging regime, said detecting method is characterized by comprising at least a step (A) of measuring an elapse of time (t) from the time when the constant current charging mode is shifted to the constant voltage charging mode and measuring a charge current value I in the constant voltage charging mode, a step (B) of obtaining a period of time from said shift time to the constant voltage charging in the constant voltage charging mode until the time when said charge current value I in the constant voltage charging mode reaches a given current value $I_M$, and a step (C) of obtaining a charged electricity quantity of the inspective rechargeable battery in the constant voltage charging mode. The detecting method may include a step (D) of referring to charge current characteristics of a corresponding normal rechargeable battery as a reference standard of the inspective rechargeable battery in the constant voltage charging mode when said normal rechargeable battery is charged by the constant current-constant voltage charging regime.

The internal information of the inspective rechargeable battery which is acquired by the detecting method of the present invention includes facts about the presence or absence of short circuit, electricity storable capacity (storable electricity quantity), internal resistance, remaining capacity (=presently stored electricity quantity= dischargeable capacity), and usable capacity (=presently residual electricity quantity which is still able to operate an instrument), respectively of the inspective rechargeable battery, and a combination of these items.

According to the detecting method of the present invention, even when the inspective rechargeable battery is a rechargeable whose discharge depth before the commencement of charging is unknown, to be more specific, even when additional charging is performed for an inspective rechargeable battery in which a certain quantity of electricity is still remained, internal information thereof represented by the electricity storable capacity can be acquired.

In the detecting method of the present invention, in the case where the charge time in the constant voltage charging mode becomes infinite, when the charge current value takes a positive value, the inspective rechargeable battery is judged to be short-circuited. When the charge current is converged to zero, the inspective rechargeable battery is judged to be not short-circuited.

However, there will be an occasion in that a short-circuited magnitude is quite large such that the constant current charging mode is not shifted to the constant voltage charging mode in the constant current-constant voltage charging regime. In that case, the above judgment with respect to short circuit cannot be adopted.

The detecting method of the present invention preferably includes a step (D) of referring to charge current characteristics of a corresponding normal rechargeable battery as a reference standard of the inspective rechargeable battery in the constant voltage charging mode when said normal rechargeable battery is charged by the constant current-constant voltage charging regime.

The charge current characteristics of the normal rechargeable battery upon the constant voltage charging mode in the foregoing step D include previously measured data of the normal rechargeable battery, relation expressions obtained from said previously measured data, data of the normal rechargeable battery which are obtained from the simulation by a computer, and function equations obtained from said data.

In the following, description will be made of a series of experiments conducted by the present inventors through which the above-described findings where obtained.

First, for an inspective rechargeable battery which is short-circuited, experiments were conducted in order to find out the charge characteristics of the rechargeable battery by using a short-circuited rechargeable battery model wherein a resistor is connected to the rechargeable battery in parallel connection and the rechargeable battery is charged by a constant current-constant voltage charging regime, where transition of the charge current in the constant voltage charging mode is observed.

FIG. 3(1) is a schematic diagram of an electric circuit in which a resistor $r_p$ is electrically connected to a normal rechargeable battery (which is not short-circuited) having an internal resistance R in parallel connection and a charger is electrically connected to said rechargeable battery. A portion surrounded by a broken line in the figure indicates the rechargeable battery. In this case, the resistor $r_p$ corresponds to a short-circuited portion of the rechargeable battery and therefore, the rechargeable battery can be called a pseudo short-circuited rechargeable battery. Now, when a charge current $I_c=I_b+I_r$ is flown from the charger, a current $I_b$ is flown to the battery and a current $I_r$ is flown to the resistor $r_p$ as the short-circuited portion of the battery. Here, it can be considered such that the internal resistance R' of the pseudo short-circuited rechargeable battery having the resistor connected thereto in parallel connection is reduced to a parallel combined resistance of the R and the $r_p$, that is, $R'=R\times r_p/(R+r_p)$.

FIG. 3(2) shows a graph of a case in that in FIG. 3(1), a commercially available lithium ion rechargeable battery whose nominal capacity is 1300 mAh and having a diameter of 17 mm and a height of 67 mm was used as the rechargeable battery and the lithium ion rechargeable battery was charged by the constant current-constant voltage charging regime, said graph exemplifying curves of changes in the battery voltage (V) and the charge current (A) to a charge time when the rechargeable battery was charged at a constant current of 1A and at a constant voltage of 4.2 V for a case wherein the resistor $r_p$ was not connected to the lithium ion rechargeable battery, a case wherein a resistor $r_p$ of 22 Ω was connected to the rechargeable battery, and a case wherein a resistor $r_p$ of 10 Ω was connected to the rechargeable battery.

In FIG. 3(2), the obscissa axis indicates a charge time, the vertical axis on the left side indicates a charge current value (A), and the vertical axis on the right side indicates a battery voltage (V).

From the charge current curves shown in FIG. 3(2), the following facts were obtained. In the case where no resistor is connected to the rechargeable battery, namely, the rechargeable battery is not short-circuited, when the charge time becomes infinite, the charge current becomes to be zero. In the case where the resistor is connected to the rechargeable battery, namely, the rechargeable battery is short-circuited, when the charge time becomes infinite, the charge current becomes not to be zero but it becomes to have a positive value.

More particularly, in FIG. 3(1), after the charging progresses and the open-circuit voltage of the charged rechargeable battery reaches a charge voltage $V_{max}$ in the constant voltage charging mode, no charge current is flown in the rechargeable battery, namely, $I_b$=0. On the other hand, a given current $I_r$=$V_{max}/r_p$ is still continued flowing in the resistor $r_p$, namely, becoming to be $I_c$=$I_b$+$I_r$=$V_{max}/r_p$. Thus, it is considered such that even after the open-circuit voltage of the rechargeable battery reaches the charge current $V_{max}$, the charge current $I_c$ outputted by the charger does not converge to zero (0) but it becomes a given current value.

Separately, the present inventors conducted experiments in order to find out the charge characteristics of a rechargeable battery whose electricity storable capacity is not small but whose internal resistance is quite large by using a model electric circuit in which a resistor $r_s$ is connected to a normal rechargeable battery in series connection to intentionally increase the internal resistance of the rechargeable battery and the rechargeable battery is charged by a constant current-constant voltage charging regime, where transition of the charge current in the constant voltage charging mode is observed.

FIG. 4(1) is a schematic diagram of an electric circuit in which a resistor $r_s$ is electrically connected to a normal rechargeable battery (which is not short-circuited) having an internal resistance R in series connection and a charger is electrically connected to said rechargeable battery. A portion surrounded by a broken line in the figure indicates the rechargeable battery. In this case, the resistor $r_s$ corresponds to a increased magnitude in the internal resistance of the rechargeable battery.

FIG. 4(2) shows a graph of a case in that in FIG. 4(1), a commercially available lithium ion rechargeable battery whose nominal capacity is 1300 mAh and having a diameter of 17 mm and a height of 67 mm was used as the rechargeable battery and the lithium ion rechargeable battery was charged by the constant current-constant voltage charging regime, said graph exemplifying charge current curves of changes in the charge current (A) to a charge time when the rechargeable battery was charged at a constant current of 1A and at a constant voltage of 4.2 V for a case wherein the resistor $r_s$ was not connected to the lithium ion rechargeable battery, a case wherein a resistor $r_s$ of 55 Ω was connected to the rechargeable battery, a case wherein a resistor $r_s$ of 89 Ω was connected to the rechargeable battery, a case wherein a resistor $r_s$ of 110 Ω was connected to the rechargeable battery, and a case wherein a resistor $r_s$ of 150 Ω was connected to the rechargeable battery.

FIG. 4(3) shows a graph exemplifying curves of changes in the charge voltage (V) to charge time when the rechargeable battery was charged at a constant current of 1A and at a constant voltage of 4.2 V for the five cases in the above.

From the charge current curves shown in FIG. 4(2), the following facts were obtained. The charge current curves substantially intersect at a certain current value (this current value will be hereinafter occasionally referred to as "charge current curve intersection current value") without depending on the resistance value of the resistor connected to the rechargeable battery. To be more specific, FIG. 4(2) indicates that the charge current curves of the rechargeable batteries whose internal resistance is increased intersect with the charge current curve of the normal rechargeable battery where no resistor $r_s$ is present at a certain current value.

The charge current curve intersection current value herein is 0.5 A which is corresponding to ½ of the current value in the constant current charging mode. However, in consideration of an error in the measurement, it can be said to be 0.4 to 0.6 time the current value in the constant current charging mode.

In addition, a change rate (a reduction rate) of the charge current value to the charge time in the constant voltage charging mode is decreased as the resistance value connected in series connection is increased. Also for the rechargeable battery whose internal resistance is intentionally increased by connecting the resistor in series connection, when the charge time becomes infinite, the charge currents converge to zero, where the charged electricity quantity becomes to be substantially the same as that of the normal rechargeable battery to which the resistor is not connected.

That is, in the case where each of the normal rechargeable battery and the rechargeable battery whose internal resistance is solely increased is charged until the charge current value becomes to be zero, the charged electricity quantity of the former is substantially the same as that of the latter.

Separately, from FIG. 4(3), it is understood that as the resistance value connected in series connection is increased, the time until reaching the given voltage, namely, the charge time at the constant current is shortened, where at an early stage after the commencement of the charging, the constant current charging mode is shifted to the constant voltage charging mode.

Further, in order to obtain a concrete position of the charge current curve intersection and a function formula of the charge current curves based on the data upon the charging in FIG. 4(2), in accordance with the function formula, computation was conducted in order to find out whether the charge current curves intersect at a substantially identical point without depending on the resistance value of the resistor connected in series connection, namely whether the charge time until reaching a certain charge current value becomes the same in any case, and what the current value is when the charge current curves intersect.

Particularly, because it is difficult to obtain a function formula of the charge current curves to the charge time at one time, the following procedures were taken. That is, a function formula for fitting is obtained from the patterns of curves respectively of a relationship Q(t) of the charged electricity quantity Q to the charge time t and the measured values. Then, the function of the charged electricity quantities to the charge times is time-differentiated and differences between the time-differentiated results and the current values of the measured values are obtained. Successively, the curves of the differences are converted into a functional formula. And finally, a functional formula of the curves of the charge current to the charge times of the rechargeable battery having the resistor connected thereto in series connection is obtained.

Specifically, the function formula of the curves of the charged quantity to the charge time of the rechargeable battery having the resistor connected thereto in series connection was obtained by a step-by-step manner as will be described below.

First, it was presumed that a relationship of the charged electricity quantity to the charge time at the time of the constant voltage charging mode in the constant current-constant voltage charging regime can be represented by the following relation equation (4).

$$Q(t) = C_1 \times \{1 - \exp\{-C_2 \times (t - C_0)\}\} + C_3 \quad (4)$$

(where $C_1 \times C_2 = 1$)

Then, various resistors were separately connected to a normal rechargeable battery in series connection and the rechargeable battery was charged by the constant current-constant voltage charging regime, where experimental data of the charged electricity quantity to the charge time were obtained for each of the resistors, and curves of the resultant data were obtained. The resultant curves were subjected to curve-fitting to obtain relationships between $C_0$, $C_1$, $C_2$ and $C_3$ in the relation equation (4) and the resistance values connected in series connection. Here, exp{ } in the relation equation (4) indicates a multiplier { } of a bottom e of a natural logarithm.

Successively, since the current value can be expressed by a time-differentiation dQ/dt of the electricity quantity Q, the opposite sides of the relation equation (4) were time-differentiated to obtain the following relation equation (5).

$$I_A(t) = \exp\{-C_2 \times (t - C_0)\} \quad (5)$$

Then, the measured data of the charge current value to the charge time and the relation equation (5) were compared to obtain a curve of a difference ΔI(t). Presuming that from the pattern of the curve, the difference ΔI(t) can be represented by the following relation equation (6), $$\Delta I(t) = C_5 \times \{(t - C_0)/C_4\}^{C_6} = \exp[1 - \{(t - C_0)/C_4\}^{C_6}] \quad (6)$$

relationships between $C_4$, $C_5$ and $C_6$ in the relation equation (6) and the resistance values connected in series connection were obtained.

From the resultant relationships between $C_0$, $C_1$, $C_2$, $C_3$, $C_4$, $C_5$, and $C_6$ and the resistance values connected in series connection, the relationships of the charge current values to the charge times were enciphered into the following relation equation (7).

$$I(t) = I_A(t) + \Delta I(t) = \exp\{-C_2 \times (t - C_0)\} + C_5 \times \{(t - C_0)/C_4\}^{C_6} \times \exp[1 - \{(t - C_0)/C_4\}^{C_6}] \quad (7)$$

In practice, various resistors were separately connected to a commercially available lithium ion rechargeable battery whose nominal capacity is 1300 mAh and having a diameter of 17 mm and a height of 67 mm in series connection to increase the internal resistance of the rechargeable battery and the rechargeable battery in each case was charged by the constant current-constant voltage regime, where the charge characteristics were measured to obtain charge current curves to the internal resistance values and the charge times, and the resultant charge current curves were expressed by the mathematical function in accordance with the above-described procedures. As a result, a relationship of each of the $C_0$, $C_2$, $C_4$, $C_5$ and $C_6$ in the relation equation (7) to the resistance value $r_s$ could be represented by the following relation equation.

$$C_0 = 2715.17 \times \exp(-0.0110319 \times r_s)$$

$$C_2 = 0.000525602 \times \exp(-0.0046066 \times r_s)$$

$$C_4 = 20.8542 \times r_s$$

$$C_5 = 0.163965$$

$$C_6 = 0.234332 \times (\exp(0.00937306 \times r_s) - 1) + 1$$

In FIG. 5(1), the measures data of the relationships of the charge current values to the charge times of the rechargeable battery having the resistor connected thereto in series connection are shown in circles and the data computed from the above equation are shown in solid lines. From FIG. 5(1), it is understood that the equation concerning the charge current which is agreed very well with the measured data from the stage immediately before the constant current charging mode was shifted to the constant voltage charging mode could be obtained. In FIG. 5(1), the linear line portion of the constant current value in the constant current charging mode is not accurately reflected in the charge current curve (the solid line), that is, compensation of the time when the charge current is constant (the time of the constant current charging mode) is necessitated.

Accordingly, the compensation of the time of the constant current charging mode was conducted as will be described below.

In the case where each of (i) a normal rechargeable battery and (ii) a normal rechargeable battery to which a resistor is connected in series connection is charged by the constant current-constant voltage charging regime, the total charged electricity quantity of the rechargeable battery (i) ought to be substantially the same as that of the rechargeable battery (ii).

In this connection, with respect to a normal rechargeable battery (i) and an inspective rechargeable battery (ii) (comprising a normal rechargeable battery having a resistor connected thereto in series connection), the shift magnitude (the shift time) with respect to the time axis in order to compensate the function equation (7) of the rechargeable battery (ii) to which a resistance value $r_s$ is connected so that the charged electricity quantity of the rechargeable battery (i) until the charge current value becomes to be zero, namely, the time-related integration value of the function equation (7) of the rechargeable battery (i) becomes to be identical with that of the rechargeable battery (ii), namely, a difference between the commencement time of the constant voltage charging mode in the rechargeable battery (i) and that in the rechargeable battery (ii) was computed. Then, a function formula (7') based on the function formula (7) of the rechargeable battery (ii) [compensated the shift magnitude (the shift time)] having the resistance value $r_s$ connected thereto was obtained, and a current value where the current value of the function formula (7) of the rechargeable battery (i) becomes identical with the current value of the function formula (7') of the rechargeable battery (ii).

FIG. 5(2) shows a graph of current values at intersections between a charge current curve of the rechargeable battery (i) with respect to the resistance value ($r_s=0$) and charge current curves of the rechargeable battery (ii) with respect to the varied resistance values($r_s$) are plotted.

Here, also from the mathematical expression of the charge current curve upon the constant voltage charging mode, it was confirmed that without depending on the resistance value of the resistor, the charge current curve intersects at a current value of 0.5 A, which is corresponding to about ½ of the current value (1A) in the constant current charging mode.

Now, in the case of a rechargeable battery free of a reduction in the battery capacity, the stored electricity quantity when the rechargeable battery is charged by the constant current-constant voltage charging regime until the charge current value becomes to be substantially zero always becomes identical notwithstanding an increase in the internal resistance.

Incidentally, in the case of an inspective rechargeable battery whose electricity storable capacity solely is D time (D is a constant of $0<D\leq 1$) that of the corresponding normal rechargeable battery, the present inventors obtained a finding through experiments that the charge current curve of the inspective rechargeable battery wherein the charge current values with respect to the charge times at the time of the charging by the constant current-constant voltage charging regime are plotted is substantially agreed with a curve in which the charge current curve of the normal rechargeable battery times D in a direction of the time axis.

Based on this finding, there was also obtained a finding that for an inspective rechargeable battery whose internal resistance is increased and whose electricity storable capacity is decreased by D time that of the corresponding normal rechargeable battery, the charge current curve of the inspective rechargeable battery wherein the charge current values with respect to the charge times at the time of the charging by the constant current-constant voltage charging regime are plotted is multiplied by 1/D time in a direction of the time axis intersects with the charge current curve of the normal rechargeable battery in the constant voltage charging mode at a certain charge current value, where a stored electricity quantity of the inspective rechargeable battery which is obtained from the 1/D timed charge current curve becomes to be identical with that of the normal rechargeable battery. And from these relationships, a reduction ratio D in the electricity storable capacity of the inspective rechargeable battery can be obtained.

A first feature of the detecting method for detecting internal information of an inspective rechargeable battery in the present invention resides in the following point.

That is, for an inspective rechargeable battery which is not short-circuited, when the inspective rechargeable battery is charged by a constant current-constant voltage charging regime, presuming that the electricity storable capacity of the inspective rechargeable battery is reduced to a magnitude of D time that of a corresponding normal rechargeable battery [where D is a constant of $0<D\leq 1$; when D=1, it is judged that the electricity storable capacity is not reduced]; when for the inspective rechargeable battery, a period of time until reaching a given current value $I_M$ since the time when the charging mode is switched to the constant voltage $V_{max}$-charging mode from the constant current $I_0$-charging mode is made to be $t_M'$ and a total electricity quantity charged by the charging mode at the constant voltage $V_{max}$ is made to be $Q_{CV}'$; and for the normal rechargeable battery, aforesaid time is made to be $t_M$ and aforesaid total electricity quantity is made to be $Q_{CV}$, from the following relation equation (1), the electricity storable capacity of the inspective rechargeable battery is judged to be D time that of the normal rechargeable battery.

$$D=(Q_{CV}'-I_0\times t_M')/(Q_{CV}-I_0\times t_M) \quad (1)$$

Accordingly, when the electricity storable capacity of the normal rechargeable battery is made to be C, it is possible to compute that the electricity storable capacity of the inspective rechargeable battery $C'=C\times D$.

When the charge current value at the time of the constant current charging mode is made to be $I_0$, the foregoing given current value $I_M$ is desired to be preferably in a range of $0.4\times I_0 \leq I_M \leq 0.6\times I_0$ or more preferably in a range of $I_M=0.5\times I_0$.

A second feature of the detecting method of the present invention resides in the following point.

That is, for an inspective rechargeable battery whose electricity storable capacity is D time that of a corresponding normal rechargeable battery, when the stored electricity quantity of the battery at the time when the charging mode is shifted to the constant voltage $V_{max}$ from the constant current value $I_0$ is made to be $Q_0'$ and a period of time until reaching a given current value $I_M$ since the shift time to the constant voltage charging is made to be $t_M'$, and for the normal rechargeable battery, aforesaid stored electricity quantity is made to be $Q_0$ and aforesaid period of time is made to be $t_M$;

$Q_0''(Q_0''=Q_0'/D)$ which is obtained from the following relation equation (2);

$$Q_0'=Q_0-I_0\times(t_M'/D-t_M) \quad (2)$$

and when from a relation formula Voc(Q) between the stored electricity quantity Q and the open-circuit voltage Voc of the normal rechargeable battery and also from a relation formula $R_{I0}$(Q) between the internal resistance $R_{I0}$ of the normal rechargeable battery at the time of the charging mode at the constant current $I_0$ and said stored electricity quantity Q, the open-circuit voltage and the internal resistance of the normal rechargeable battery when the stored electricity quantity of the inspective rechargeable battery is $Q_0''$ are respectively Voc($Q_0''$) and $R_{I0}(Q_0'')$ and the internal resistance of the inspective rechargeable battery when the stored electricity quantity thereof is $Q_0''$ is $R_{I0}'(Q_0'')$; from the following relation equation (3), internal information relating to the internal resistance of the inspective rechargeable battery is detected.

$$R_{I0}'(Q_0')/R_{I0}(Q_0'')=\{V_{max}-VOC(Q_0'')\}/\{I_0(Q_0'')\times R_{I0}(Q_0'')\} \quad (3)$$

The above Voc(Q) of the open-circuit voltage Voc to the stored electricity quantity Q of the normal rechargeable battery and the above $R_{I0}$(Q) of the internal resistance $R_{I0}$ to the stored electricity quantity Q of the normal rechargeable battery are obtained from the previously measured data of the normal rechargeable battery, the relation equations obtained from said data, or the relation equations obtained by way of simulation by means a computer.

The above $R_{I0}$(Q) can be computed from the following relation equation when the internal resistance of the normal rechargeable battery at the time of the charging mode at the constant current $I_0$ is made to be $R_{I0}$(Q) and the battery voltage and the open-circuit voltage of the normal rechargeable battery are mode to be respectively $V_{I0}$(Q) and Voc(Q).

$$R_{I0}(Q)=\{V_{I0}(Q)-Voc(Q)\}/I_0$$

Now, an increased magnitude in the internal resistance of the inspective rechargeable battery in relation to the normal rechargeable battery can be obtained also by using the previously described equation (7). Particularly, the current curve of the charge current values in the constant voltage charging mode is multiplied by 1/D time in a direction of the time axis (this means that a magnitude corresponding to a stored electricity quantity is compensated), whereby an increased resistance magnitude as a resistance value $r_s$ which agrees with the equation (7) can be obtained.

Further, the detecting method of the present invention also has a feature in the following point. That is, when the electricity storable capacity of the inspective rechargeable battery is judged to be D time that of the normal rechargeable battery, presuming that from a correction coefficient f(i, T) which is decided by the electricity storable capacity $C_N$, the discharge current i and the temperature T of the normal rechargeable battery, the total discharged electricity quantity $C_d$ of the normal rechargeable battery can be expressed by $C_d=C_N\times f(i, T)$ and the total discharged electricity quantity $C_d'$ of the inspective rechargeable battery can be expressed by $C_d'=D\times C_N\times f(i, T)$, when for an instrument in which the inspective rechargeable battery is used as a power source, the average consumption current of the instrument is made to be i, the average consumption power of the instrument is made to be p, and the average battery voltage of the inspective rechargeable battery is made to be Vm, the remaining actuation duration h of the instrument is computed in accordance with the equation h=(D×$C_d$)/i or h=(Vm×D×$C_d$)/p. Further, the remaining actuation duration h of the instrument can be more precisely computed in accordance with the following equation in which a correction coefficient r which is decided from the above-described information concerning the increase in the internal resistance is used.

$$h=(1/r)\times(D\times C_d)/i \text{ or } h=(1/r)\times(Vm\times D\times C_d)/p$$

In the foregoing correction coefficient f(i, T) which is decided by the charge current i and the temperature T, previously measured data obtained using the normal rechargeable battery, function equations obtained on the basis of said data, data or function equations with respect to the charge characteristics which are obtained by way of simulation by means of a computer can be selectively used.

The detecting method for detecting internal information of a rechargeable battery in the present invention can be applied for detecting internal information of various rechargeable batteries which are charged by the constant current-constant voltage charging regime. As representative specific examples of such rechargeable battery, there can be mentioned rechargeable lithium batteries (including lithium ion rechargeable batteries) in which oxidation-reduction reaction of lithium is used. However, this is not limitative.

The present invention includes a program for detecting internal information of a rechargeable battery, in which the above-described detecting method of the present invention for detecting internal information of a rechargeable battery is applied.

The present invention also includes a detecting apparatus for detecting internal information of an inspective rechargeable battery in which the above-described detecting method of the present invention for detecting internal information of a rechargeable battery is applied. To be more specific, the detecting apparatus of the present invention comprises at least a means for measuring a charge current value I when charged by the constant current-constant voltage charging regime; a means for measuring a time (t) from a time when the constant current charging mode at a constant current value $I_0$ is shifted to the constant voltage charging mode at a constant voltage $V_{max}$; a means for measuring a time ($t_M'$) when the charge current value in the constant voltage charging mode becomes to be a given current value $I_M$; a means for measuring a charged electricity quantity $Q_{vc}'$ in the constant voltage charging mode; a memory means in which an electricity storable capacity (or a nominal capacity) $C_N$ of a corresponding normal rechargeable battery as a reference standard for the inspective rechargeable battery and internal information of said normal rechargeable battery when said normal rechargeable battery is charged by the constant current-constant voltage charging regime are memorized, said internal information including a time ($t_M$) when the charge current value in the constant voltage charging mode becomes to be a given current value $I_M$ and a charged electricity quantity $Q_{CV}$ in the constant voltage charging mode; and an arithmetic means for computing an electricity storable capacity ($C_N'$) of the inspective rechargeable battery based on said $C_N$, $t_M$ and $Q_{VC}$ of the normal rechargeable battery which are memorized in said memory means and said $t_M'$ and $Q_{VC}'$ detected from the inspective rechargeable battery.

The present invention further includes a battery pack comprising one or more rechargeable battery units, a charger for a rechargeable battery, an instrument in which a rechargeable battery is used as a power source, and an inspection equipment for inspecting a rechargeable battery, where in each of these, the above-described detecting method of the present invention for detecting internal information of a rechargeable battery is applied.

In the battery pack, by transmitting internal information of the rechargeable battery to an instrument having the battery pack connected thereto, the performance of the instrument can be utilized to the maximum and the operation of the instrument can be prevented from being suddenly stopped. In the charger, a reduction in the performance of the rechargeable battery upon the charging can be surely grasped. In the instrument in which the rechargeable battery is used as the power source, the practically usable capacity (the presently residual electricity quantity) of the rechargeable battery can be detected at a high precision and therefore, the control of the power source can be readily performed to extend the operation time of the instrument. In the inspection equipment, the quality control inspection of whether rechargeable batteries are good or inferior can be surely performed prior to shipping them.

Incidentally, the present inventors conducted experiments in order to confirm whether the phenomenon in that the charge current curve of a given inspective rechargeable battery whose internal resistance only is increased upon the constant voltage charging substantially intersects with that of a corresponding normal rechargeable battery as a reference standard for the inspective rechargeable battery at a certain current value (this current value corresponds to the foregoing "charge current curve intersection current value") is valid in general. As a result, in a number of different kinds of lithium ion rechargeable batteries, it was confirmed that the charge current curve of each of them upon the constant voltage charging substantially intersects with that of a corresponding normal rechargeable battery at a certain current value which is corresponding to a value of ½ of the current value in the constant current charging mode. Therefore, it can be said that this value of ½ of the current value in the constant current charging mode is valid in general. Here, in consideration of an error in the measurement, it is appropriate to consider by making the charge current curve intersection current value to have an allowance corresponding to a value of 0.4 to 0.6 time the current value of the normal rechargeable battery in the constant current charging mode. To be more specific, because the charge current curve intersection current value which is peculiar depending on the kind of a rechargeable battery can be readily obtained by way of discussion through experiments, even when the charge current curve intersection current value of a given inspective rechargeable battery should be of a value which is apart from aforesaid ½ value, the present invention (which will be detailed later) can be applied. In addition, even when there will be an occasion in that the charge current curve upon the constant voltage charging does not substantially intersect at a certain current value, as long as the approximate charge current curve intersection current value can be determined, the present invention (which will be detailed later) can be applied. In that case, the "certain current value $I_M'''$" described in claims (which will be described later) corresponds to a current value of the charge current curve intersection approximately determined.

In the following, the present invention will be detailed while referring to the drawings.

In a preferred typical embodiment of the detecting method of the present invention, internal information (for instance, concerning electricity storable capacity) of an inspective rechargeable battery in the case where the rechargeable battery is charged by the constant current-constant voltage charging regime is detected by utilizing such phenomena as will be described below.

(1) In the case where the inspective rechargeable battery is an inspective rechargeable battery whose internal resistance only is increased, when the charge time is prolonged to an extent such that the charge current value comes closer to zero, the full-charged electricity quantity of the inspective rechargeable battery becomes substantially equal to that of a corresponding normal rechargeable battery when the normal rechargeable battery is charged by the constant current-constant voltage charging regime.

To be more specific, the electricity storable capacity of a rechargeable battery corresponds to an electricity quantity charged from the discharge depth of 100% to full charge and it is equal to an area surrounded by the charge current curve and the charge time. Therefore, the area surrounded by the charge current curve and the charge time in the inspective rechargeable battery (whose internal resistance only is increased) becomes to be substantially the same as that in the normal rechargeable battery.

(2) The charge current curve of the inspective rechargeable battery (whose internal resistance only is increased) in the constant voltage charging mode intersects with the charge current curve of the normal rechargeable battery in the constant voltage charging mode at a certain current value of the current value in the constant current charging mode of the normal rechargeable battery [see, FIG. 4(2)] where said certain current value is, for instance, ½ of said current value.

Figure 2:
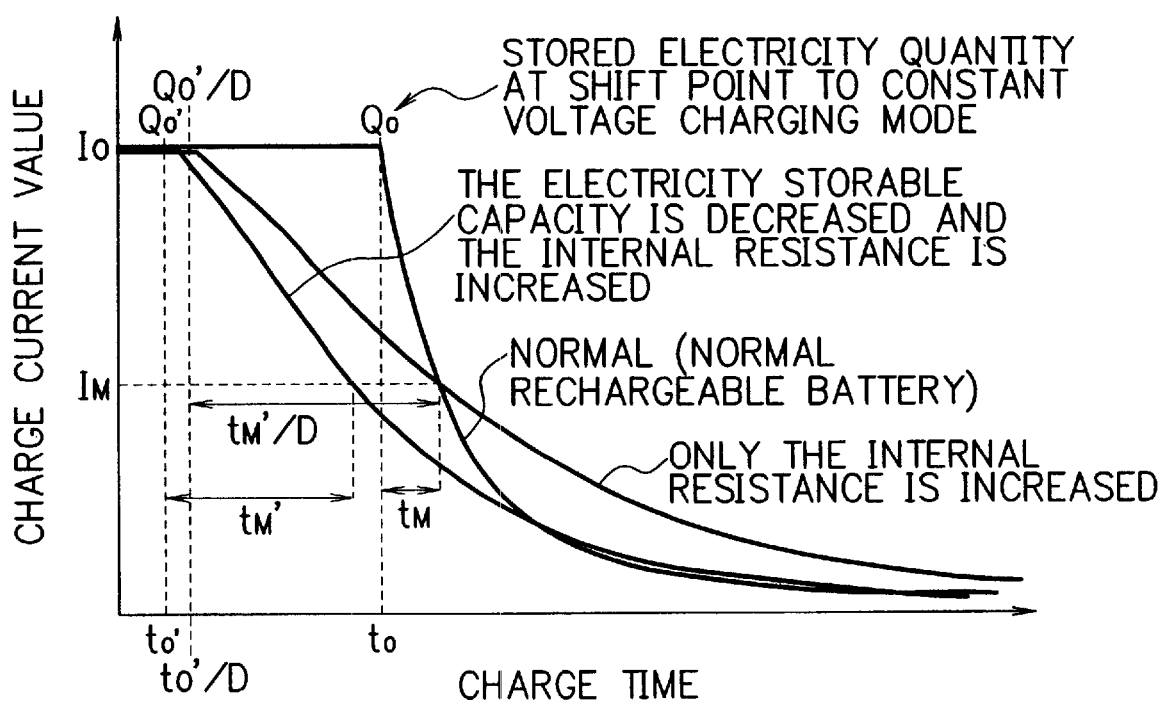
FIG. 2 shows an example of a graph exemplifying charge current transition (or current profile) to charge time with respect to each of a normal rechargeable battery, a rechargeable battery whose internal resistance is increased and a rechargeable battery whose internal resistance is increased and whose electricity storable capacity is decreased, when each of them has charged by a constant current-constant voltage charging regime, for explaining equations used in the detecting method of the present invention.

(3) In the case where the inspective rechargeable battery is (a) an inspective rechargeable battery whose electricity storable capacity (storable electricity quantity) is deteriorated to an extent of D time that of (b) a corresponding normal rechargeable battery and whose internal resistance is increased, when the charge current curve of the inspective rechargeable battery (a) in the constant current-constant voltage (CCCV) charging is multiplied by 1/D in a direction of the charge time axis [for instance, see, FIG. 2], there can be obtained a charge current curve of an inspective rechargeable battery (a') (whose internal resistance only is increased) in the constant current-constant voltage charging mode.

To be more specific, in the case of (a) an inspective rechargeable battery whose electricity storable capacity is deteriorated to an extent of D time that of (b) a corresponding normal rechargeable battery as a reference standard for the inspective rechargeable battery, an area of the inspective rechargeable battery (a) which is surrounded by the charge current curve and the charge time in the constant current-constant voltage (CCCV) charging (this area will be hereinafter referred to as "charge current curve-charge time area") becomes to be D time that of the normal rechargeable battery (b). This indicates that when the charge current curve-charge time area of the inspective rechargeable battery is multiplied by 1/D, the resultant area becomes to be equal to a charge current curve-charge time area of not only the normal rechargeable battery but also an inspective rechargeable battery (a') whose internal resistance only is increased.

That is, as above described, in the case of an inspective rechargeable battery whose electricity storable capacity (storable electricity quantity) is deteriorated to an extent of D time that of a corresponding normal rechargeable battery and whose internal resistance is increased, when the charge current curve of the inspective rechargeable battery in the constant current-constant voltage (CCCV) charging is multiplied by 1/D in a direction of the charge time axis, there can be obtained a charge current curve of an inspective rechargeable battery whose internal resistance only is increased in the constant current-constant voltage (CCCV) charging.

Preferred embodiments of the detecting method of the present invention will be described with reference to the drawings.

FIG. 1 shows a flow chart illustrating an embodiment of the detecting method of the present invention, for detecting internal information of a rechargeable battery during the time when said rechargeable battery is charged by the constant current-constant voltage charging regime.

Description will be made of the detecting method of the present invention with reference to FIG. 1.

As the start of the detection, in Step 1, an inspective rechargeable battery is judged whether or not it is short-circuited. In the case where the inspective rechargeable battery is judged to be short-circuited, if necessary, the fact in that the inspective rechargeable battery is short-circuited is warned (Step 2).

In the case where the inspective rechargeable battery is judged to be not short-circuited, to charge the inspective rechargeable battery by the constant current-constant voltage charging regime (the CCCV charging regime) is commenced (Step 3). Particularly, to charge the inspective rechargeable battery by the constant current charging mode is commenced (Step 4).

If desired so, it is possible that Step 1 is skipped. However, in that case, it is generally necessitated to have a judgment step to judge whether or not the inspective rechargeable battery is short-circuited at least during the constant current charging or after the termination of the constant current charging. In the case where it is previously known that the inspective rechargeable battery is not short-circuited, it is not necessary to have said judgment step.

In Step 5 and Step 6, at a time when the battery voltage reaches a given voltage, the constant current charging mode is shifted to the constant voltage charging mode, where a charge current value and a charge time are measured (Step 7).

In Step 8 and Step 9, at a time when the charge termination conditions are satisfied, the constant voltage charging is terminated. It is possible to have a judgment step to judge whether or not the inspective rechargeable battery is short-circuited between Step 8 and Step 9 or between Step 9 and Step 10.

In Step 12, from the charge current value and the charge time measured in Step 7, a charged electricity quantity of the inspective rechargeable battery is computed and in Step 13, a time when the charge current value becomes to be a given current value is memorized. Using said charged electricity quantity and said time together with previously acquired internal information of a corresponding normal rechargeable battery, i.e., the time from the shift time to the constant voltage charging mode until the time when the charge current value became to be a given current value and the total electricity quantity charged in the constant voltage charging mode, in Step 10, when the inspective rechargeable battery is not short-circuited, in accordance with the foregoing equation (1), an electricity storable capacity of the inspective rechargeable battery or a capacity ratio D of said electricity storable capacity to that of the normal rechargeable battery is computed.

In the case where it is intended to obtain information concerning the internal resistance of the inspective rechargeable battery from the results in Step 10, previously acquired relationship Voc(Q) of the open-circuit voltage Voc to the charged electricity quantity Q with respect to the normal rechargeable battery, and the foregoing equation (3), in Step 11, an internal resistance of the inspective rechargeable battery or an internal resistance ratio of said internal resistance to that of the normal rechargeable battery is obtained.

A principal feature of the preferred embodiment of the detecting method of the present invention shown in FIG. 1 resides in Step 7, Step 12 and Step 13 which are continued from Step 7, and Step 10 which is continued from Step 13, where when the inspective rechargeable battery is charged by the constant current-constant voltage charging regime, a time $t_M'$ from the time when the constant current charging mode at a constant current $I_0$ is shifted to the constant voltage charging mode at a constant voltage $V_{max}$ until the time when the charge current becomes to be a given current value $I_M$ is measured, and a total electricity quantity $Q_{cv}'$ charged at the constant voltage $V_{max}$ is measured or computed; and using said time $t_M'$ and said charged electricity quantity $Q_{cv}'$ together with previously acquired internal information of the normal rechargeable battery, i.e., the time $t_M$ from the shift time to the constant voltage charging mode until the time when the charge current value reached a given current value $I_M$, the total electricity quantity $Q_{vc}$ charged in the constant voltage charging mode, the electricity storable capacity (the nominal capacity) and calculated D in accordance with the foregoing equation (1), an electricity storable capacity of the inspective rechargeable battery is computed.

Thus, according to the detecting method of the present invention, without having information concerning the stored electricity quantity of the inspective rechargeable battery prior to subjecting the inspective rechargeable battery to the charging, information concerning the electricity storable capacity thereof can be readily obtained.

In the following, using FIG. 2, description will be made of the reason in that from the time when the charge current value becomes to be a given current value and the charged electricity quantity in the constant voltage charging mode and from the foregoing equation (1), the electricity storable capacity of the inspective rechargeable battery or a ratio of said electricity storable capacity to the electricity storable capacity of the normal rechargeable battery is obtained.

FIG. 2 shows a graph in which charge current values to charge time with respect to (a) a normal rechargeable battery which is not short-circuited and which is free from an increase in the internal resistance and a decrease in the electricity storable capacity and (b) an inspective rechargeable battery whose internal resistance is increased and whose electricity storable capacity is decreased by D time that of the normal rechargeable battery when each of the batteries (a) and (b) has charged by a constant current-constant voltage charging regime (in that from the discharge depth of 100%, the charging is commenced at a constant current value $I_0$ and after the battery voltage reaches a given voltage $V_{max}$, the charging is performed at a constant voltage $V_{max}$ until the termination thereof) are plotted.

In FIG. 2, $t_0$ and $Q_0$ are of the normal rechargeable battery (a), where $t_0$ is a time elapsed from the commencement time of the charging at the time of shifting to the constant voltage charging mode, and $Q_0$ is an electricity quantity stored until the time $t_0$; and $t_0'$ and $Q_0'$ are of the inspective rechargeable battery (b), where $t_0'$ is a time elapsed from the commencement time of the charging at the time of shifting to the constant voltage charging mode, and $Q_0'$ is an electricity quantity stored until the time $t_0'$.

Now, in the case where the charge current curve of the inspective rechargeable battery (b) is multiplied by 1/D in a direction of the charge time axis to be a charge current curve which is corresponding to the charge current curve of an inspective rechargeable battery (b') in which only the internal resistance is increased but whose electricity storable capacity is substantially the same as that of the normal rechargeable battery (a), $t_0'/D(=t_0'')$ and $Q_0'/D(=Q_0')$ are of the inspective rechargeable battery (b'), where $t_0''$ is a time elapsed from the commencement time of the charging at the time of shifting to the constant voltage charging mode, and $Q_0'$ is an electricity quantity stored until the time $t_0''$.

Here, the charge current curve of the inspective rechargeable battery (b') in the constant voltage charging mode intersects with that of the normal rechargeable battery (a) at a charge current value $I_M$ (see, FIG. 2). At this time, when a time from the time when the constant current charging mode is shifted to the constant voltage charging mode until the time when the charge current becomes to be a current value $I_M$ with respect to the normal rechargeable battery (a) is made to be $t_M$ and that with respect to the inspective rechargeable battery (b) is made to be $t_M'$, that with respect to the inspective rechargeable battery (b') becomes to be $t_M'/D(=t_M')$.

In FIG. 2, the stored electricity quantity until the charge current becomes to be zero with respect to the normal rechargeable battery (a) is equal to that with respect to the inspective rechargeable battery (b') and therefore, a difference between the charged electricity quantity until the charge current becomes to be a current value $I_M$ during the time $=t_0+t_M$) with respect to the normal rechargeable battery (a) and that with respect to the inspective rechargeable battery (b') is equal to a difference between the charged electricity quantity until the charge current value becomes to be zero from $I_M$ with respect to the inspective rechargeable battery (b') and that with respect to the normal rechargeable battery (a).

The charged electricity quantity (=the stored electricity quantity when the charge-and-discharge efficiency is 100%) herein is a value obtained by integrating the charge current value by the charge time.

Now, when the charged electricity quantity in the constant voltage charging mode with respect to the normal rechargeable battery (a), that with respect to the inspective rechargeable battery (b) and that with respect to the inspective rechargeable battery (b') are made to be respectively $Q_{cv}$, $Q_{cv}'$ and $Q_{cv}''$, it is possible to express the relations as such equations $I_0\times(t_0-t_0''/D)+Q_{cv}=Q_{cv}''$, $(t_0-t_0'/D)=(t_M'/D-t_M)$, $Q_{cv}''=Q_{cv}'/D$, and $I_0\times(t_M'/D-t_M)+Q_{cv}=Q_{cv}'/D$.

From the above equations, there can be obtained a relationship represented by the following equation (1).

$$D=(Q_{cv}'-I_0\times t_M')/(Q_{cv}-I_0\times t_M) \qquad (1)$$

Thus, previously acquired data of a corresponding normal rechargeable, concerning the time $t_M$ from the shift time to the constant voltage charging mode until the time when the charge current value becomes to be a given current value $I_M$, the charged electricity quantity $Q_{cv}$ charged by the constant voltage charging mode and the electricity storable capacity (or the nominal capacity) are possessed, and with respect to an inspective rechargeable battery, by obtaining a time $t_M'$ from the shift time to the constant voltage charging mode until the time when the charge current value becomes to be a given current value $I_M$ and a charged electricity quantity $Q_{cv}'$ charged by the constant voltage charging mode, the electricity storable capacity of the inspective rechargeable battery can be computed in accordance with the above equation (1) when the inspective rechargeable battery is not short-circuited.

Aforesaid given current value $I_M$ is preferred to be 0.5 time the current value $I_0$ in the constant current charging mode ($I_M$=0.5×$I_0$). However, in consideration of an error in the measurement, it is preferred to be in a range of 0.4 to 0.6 time the current value $I_0$ in the constant current charging mode (0.4×$I_0$≦$I_M$≦0.6×$I_0$).

However, as previously described, because the charge current curve intersection current value $I_M$ which is peculiar depending on the kind of a rechargeable battery can be readily obtained by way of discussion through experiments, even when the $I_M$ does not fall in a specific range, the present invention can be applied.

In addition, even when there will be an occasion in that the charge current curve upon the constant voltage charging does not substantially intersect at a certain current value, in the case where an approximate charge current curve intersection current value can be determined, the present invention can be applied by regarding the approximate charge current curve intersection current as the current value $I_M$.

From the relationships of the $t_M$ and the $t_M'$ obtained in the above procedures, it is possible to judge with ease as will be described below:

(i) when ($t_M'$-$t_M$)>a>0, the internal resistance of an inspective rechargeable battery is increased than that of a corresponding normal rechargeable battery, and (ii) when ($t_M$-$t_M'$)>b>0, the electricity storable capacity of an inspective rechargeable battery is decreased than that of a corresponding normal rechargeable battery.

In the above, each of the a and the b is a constant which is decided depending on the kind of a rechargeable battery.

In addition, when a relationship of –b≦($t_M'$-$t_M$)≦a is present between an inspective rechargeable battery and a corresponding normal rechargeable battery, it may be judged that the inspective rechargeable battery is within an allowable product variation range and it belongs to a normal rechargeable battery.

Separately from the relationships of the $Q_{CV}$ and the $Q_{cv}'$ obtained in the above procedures, it is possible to judge as will be described below:

(iii) when ($Q_{cv}'$-$Q_{cv}$)>c>0, the internal resistance of an inspective rechargeable battery is increased than that of a corresponding normal rechargeable battery, and (iv) when ($Q_{cv}$-$Q_{cv}'$)>d>0, the electricity storable capacity of an inspective rechargeable battery is decreased than that of a corresponding normal rechargeable battery.

In the above, each of the c and the d is a constant which is decided depending on the kind of a rechargeable battery.

In addition, when a relationship of –d≦($Q_{cv}'$-$Q_{cv}$)≦c is present between an inspective rechargeable battery and a corresponding normal rechargeable battery, it can be judged that the inspective rechargeable battery is within an allowable product variation range and it belongs to a normal rechargeable battery.

However, in terms of strict meaning, in the case of an inspective rechargeable battery having an increase in the internal resistance and a decrease in the electricity storable capacity, there will be a case wherein –b≦($t_M'$-$t_M$)≦a or/and –d≦($Q_{cv}'$-$Q_{cv}$)≦c are satisfied. In such a case, in order to prevent occurrence of an occasion in that the inspective rechargeable battery which shall be judged to be abnormal is judged to belong to a normal rechargeable battery, special consideration is necessary to be made. For instance, in the case where $R_{10}'(Q_0")/R_{10}(Q_0")$ obtained from the foregoing equation (3) is less than a given value k and wherein –b≦($t_M'$-$t_M$)≦a and –d≦($Q_{cv}'$-$Q_{cv}$)≦c are satisfied, it is judged that the inspective rechargeable battery is normal. According to this manner, more precise judgment is possible.

Judgement of Whether or not Inspective Rechargeable Battery is Short-circuted

In the detecting method of the present invention, in order for an inspective rechargeable battery to be able to obtain a charged electricity quantity thereof, it is necessary that said inspective rechargeable battery is not short-circuited. In this respect, when the inspective rechargeable battery is charged by the constant current-constant voltage charging regime, it is preferred that the inspective rechargeable battery is confirmed to be not short-circuited before the constant current charging mode is shifted to the constant voltage charging mode. However, judgment of whether or not the inspective rechargeable battery may be conducted after the constant current charging.

Incidentally, in the case where from the transition of a change $\Delta I/\Delta t$ in the charge current value with respect to the charge time in the constant voltage charging region, even when the charge time is unlimitedly extrapolated, the charge current does not become to be zero but has a positive value, it is judged that the inspective rechargeable battery is short-circuited, where it is difficult to obtain a precise electricity storable capacity of the inspective rechargeable battery.

When the inspective rechargeable battery is maintained in a paused state without subjecting it to charging or discharging or the inspective rechargeable battery is engaged in a charging operation or a discharging operation, it is possible to judge whether or not the inspective rechargeable battery is short-circuited by detecting internal state thereof in any case.

Said internal state includes, for example, a change magnitude in the open-circuit voltage when the battery is paused, an increase rate in the battery voltage of the battery in the constant current charging mode, a decrease rate in the charge current value of the battery in the constant voltage charging mode, and a decrease rate in the battery voltage of the battery upon the discharging operation.

Particularly, in the case where the inspective rechargeable battery is paused without subjecting it to charging or discharging, when a decrease with an elapse of time in the open-circuit voltage is present, it can be judged that the inspective rechargeable battery is short-circuited.

In the case where the inspective rechargeable battery is engaged in the constant current charging operation, when an increase rate in the battery voltage or the open-circuit voltage is smaller than that of the corresponding normal rechargeable battery, it can be judged that the inspective rechargeable battery is short-circuited.

When a decrease rate in the charge current value of the inspective rechargeable battery in the constant voltage charging mode is smaller than that of the corresponding normal rechargeable battery, it can be judged that the inspective rechargeable battery is possibly short-circuited.

In this case, by unlimitedly extrapolating the charge time, it is possible to judge whether or not the internal resistance of the inspective rechargeable battery is increased or the inspective rechargeable battery is short-circuited.

In the case where the inspective rechargeable battery is engaged in the constant current discharging operation, when a decrease rate in the battery voltage or the open-circuit voltage is greater than that of the corresponding normal rechargeable battery, it can be judged that the inspective rechargeable battery is short-circuited.

Now, judgment of whether or not an inspective rechargeable battery is short-circuited in the constant current charging region of the constant current-constant voltage charging regime may be performed as will be described below.

In the case where the charge depth of the inspective rechargeable battery is 100%, the time from the commencement of the constant current charging until the shift time to the constant voltage charging in the case of the inspective rechargeable battery is longer than that in the case of a corresponding normal rechargeable battery, it can be judged that the inspective rechargeable battery is short-circuited.

In the case of an inspective rechargeable battery whose charge depth is unknown, on the basis of the shift time to the charging at a constant voltage $V_{max}$ from the charging at a constant current value $I_0$, with respect to an increase rate $\Delta V_{cc}/\Delta t$ per a time (t) in a battery voltage $V_{cc}$ (in the constant current charging mode) at a $t_{cc}$ time earlier stage before said shift time, the increase rate $\Delta V_{cc}/\Delta t$ of the inspective rechargeable battery is compared with that of a corresponding normal rechargeable battery, where when the former is smaller than the latter, it can be judged that the inspective rechargeable battery is short-circuited.

At this time, when the increase rate $\Delta V_{cc}/\Delta t$ of the inspective rechargeable battery is greater than that of the normal rechargeable battery, it can be judged that the internal resistance of the inspective rechargeable battery is increased or the electricity storable capacity thereof is decreased or internal resistance thereof is increased and the electricity storable capacity thereof is decreased in comparison with the normal rechargeable battery.

Besides, judgment of whether or not an inspective rechargeable battery is short-circuited may be performed by a simple manner as will be described in the following.

When a charge current value in the constant voltage charging immediately before the termination of the charging is less than 0.3 time the charge current value in the constant current charging, it can be judged that the inspective rechargeable battery is short-circuited.

Separately, when there is an occasion in that a change $\Delta I/\Delta t$ in the charge current value with respect to the charge time in the constant voltage charging region becomes to be a positive value, it can be judged that the inspective rechargeable battery is short-circuited.

Besides, when there is an occasion in that a change $\Delta V/\Delta t$ in the battery voltage with respect to the charge time in the constant current charging mode becomes to be a negative value, it can be judged that the inspective rechargeable battery is short-circuited.

Charge Termination Condition

The charging for a rechargeable battery by the constant current-constant voltage charging regime is generally terminated when the charge current value in the constant voltage charging mode becomes to be less than a given current value $I_{min}$ or when a given time $t_f$ is elapsed since the commencement of the charging. However, a case wherein the charging is terminated when the rechargeable battery is short-circuited or it is abnormally heated is not included in any of the above two cases.

Charged Electricity Quantity in the Constant Voltage Charging Mode

The charged electricity quantity $Q_{cv}'$ in the constant voltage charging region which is used in the foregoing equation (1) is (i) a total charged electricity quantity until the time when the charging is terminated or (ii) a total charged electricity quantity until the time when the current value in the constant voltage charging mode becomes to be zero.

It is more preferred to use said total charged electricity quantity (ii) until the time when the current value in the constant voltage charging mode becomes to be zero, in order to obtain D of the foregoing equation (1), because a more accurate value of the electricity storable capacity can be obtained in this case.

In order to obtain an electricity quantity capable of being charged by the constant current-constant voltage charging regime for the inspective rechargeable battery, it is more preferred to use said total charged electricity quantity (i) until the time when the charging is terminated, because a more accurate value of the electricity quantity charged can be obtained in this case.

However, there is not a distinguishably large difference between a computed electricity storable capacity obtained by using the total charged electricity quantity (i) and that obtained by using the total charged electricity quantity (ii).

Description of Information Concerning the Internal Resistance

Description will be made while referring to the Step 11 in FIG. 1 and FIG. 2.

There are correlations between the electricity quantity stored, the open-circuit voltage and the statistic internal resistance (when electric current is not flowing) of a rechargeable battery. And the battery voltage and the internal resistance of the rechargeable battery when the battery is engaged in the constant current charging depend on the electricity quantity stored, the battery temperature and the charge current value. In addition, the battery voltage and the internal resistance of the rechargeable battery when the battery is engaged in the constant current discharging depend on the stored electricity quantity, the battery temperature and the discharge current value.

In this connection, first, for a normal rechargeable battery (that is, a corresponding normal rechargeable battery which is used as a reference standard for an inspective rechargeable battery), a relationship Voc(Q) of the open-circuit voltage Voc is obtained in advance. Then, the normal rechargeable battery is charged by the constant current-constant voltage charging regime, where a relationship $R_{f0}(Q)$ of the internal resistance $R_{f0}$ to the stored electricity quantity Q in the constant current charging mode at a battery temperature T and at a constant current $I_0$ is obtained; and if necessary, a relationship $V_{f0}(Q)$ of the battery voltage $V_{f0}$ to the charged electricity quantity Q is also obtained.

It is more preferred that the open-circuit voltage Voc and the internal resistance $R_{f0}$ which are described in the above are obtained respectively as a function formula Voc(Q) of a relationship of the open-circuit voltage Voc to the stored electricity quantity Q and a function formula $R_{f0}(Q)$ of a relationship of the internal resistance $R_{f0}$ to the stored electricity quantity Q.

Said function formula Voc(Q) and said function formula $R_{f0}(Q)$ are obtained respectively on the basis of previously measured data of the normal rechargeable battery, relation formulas obtained from said previously measured data, data of the normal rechargeable battery which are obtained from the simulation by a computer, or function equations obtained from said data.

From the function formula Voc(Q) (of the relationship of the open-circuit voltage Voc to the stored electricity quantity Q) and the function formula $R_{f0}(Q)$ (of the relationship of the internal resistance $R_{f0}$ to the stored electricity quantity Q) which are described in the above, with respect to the normal rechargeable battery, when the stored electricity quantity is Q", the open-circuit voltage and the internal resistance become to be respectively Voc(Q") and $R_{f0}(Q')$.

Separately, when a battery voltage of the normal rechargeable battery upon the charging is made to be $V_c$ and a charge current value and an internal resistance of the battery at said battery voltage $V_c$ are made to be respectively $I_c$ and $R_c$, the relationships between the foregoing open-circuit voltage Voc, the battery voltage $V_c$, the charge current $I_c$ and the internal resistance $R_c$ can be expressed as shown by the following equation.

$$V_c = Voc + I_c \times R_c \text{ or } Voc = V_c - I_c \times R_c$$

Now, when the stored electricity quantity of the normal rechargeable battery in the constant current charging mode at the constant current value $I_0$ is $Q_0''$ [$Q_0'' = Q_0'/D$ (see, the foregoing description with reference to FIG. 2); $Q_0'$ is a stored electricity quantity of the inspective rechargeable battery at the time when the charging at the constant current $I_0$ is shifted to the charging at the constant voltage $V_{max}$], the internal resistance $R_c$ (of the normal rechargeable battery) is $R_c = R_{I0}(Q_0'')$, the open-circuit voltage Voc (of the normal rechargeable battery) is $Voc = Voc(Q_0'')$, and the relationships between the open-circuit voltage $Voc(Q_0'')$, the charge current value $I_0$, the battery voltage $V_{I0}(Q_0'')$ and the internal resistance $R_{I0}(Q_0'')$ are as shown by the following equation.

$$Voc(Q_0'') = V_{10}(Q_0' - I_0 \times R_{10}(Q_0''))$$

In FIG. 2, in the case where the stored electricity quantity of the rechargeable battery whose internal resistance only is increased at the time when the charging at the constant current $I_0$ is shifted to the charging at the constant voltage $V_{max}$ is $Q_0'$, when the internal resistance of the battery is made to be $R_{10}'(Q_0'')$, the open-circuit voltage at this time can be expressed to be: $V_{max} - I_0 \times R_{10}'(Q_0'')$.

Further, because the open-circuit voltage of the inspective rechargeable battery whose internal resistance only is increased is substantially the same as that of the normal rechargeable battery whose stored electricity quantity is $Q_0''$, the open-circuit voltage of the resistance-increased battery can be expressed by the following equation.

$$Voc(Q_0'') = V_{10}(Q_0'') - I_0 \times R_{10}(Q_0'') = V_{max} - I_0 \times R_{10}'(Q_0')$$

By modifying this equation, the equation $R_{10}'(Q_0'') = \{V_{max} - Voc(Q_0')\}/I_0$ is obtained and in addition, the following equations (3) and (3') are obtained.

$$R_{10}'(Q_0'')/R_{10}(Q_0'') = \{V_{max} - Voc(Q_0'')\}/\{I_0 \times R_{10}(Q_0'')\} \quad (3)$$

$$R_{10}'(Q_0'')/R_{10}(Q_0') = \{V_{max} - V_{10}(Q_0'')\}/\{I_0 \times R_{10}(Q_0')\} + 1 \quad (3')$$

Further, from FIG. 2, the following equation (2) is obtained.

$$Q_0'' = Q_0'/D = Q_0 \, I_0 \times (t_M'/D - t_M) \quad (2)$$

Here, $$D = (Q_{cv}' - I_0 \times t_M') / (Q_{cv} - I_0 \times t_M) \quad (1)$$

By measuring the values of the $Q_0$, $t_M$, $Q_{cv}$, $t_M'$ and $Q_{cv}'$ and substituting the measured values into the equation (2), the $Q_0'$ (the stored electricity quantity) of the capacity-decreased inspective rechargeable battery which generally cannot be obtained except for the case of the charging from the 100% discharge depth can be readily obtained even upon the charging from the charge depth of less than 100%.

Particularly, the internal information of the normal rechargeable battery, that is, the stored electricity quantity $Q_0$ (=the charged electricity quantity) charged by the constant current charging, the period of time $t_M$ during which the charge current value becomes to be $I_M$ from $I_0$ in the constant voltage charging mode, the stored electricity quantity $Q_{cv}$ (=the charged electricity quantity) in the constant voltage charging mode, and the function formulas Voc(Q) and $R_{10}(Q)$ concerning the stored electricity quantity Q are previously acquired. Under this condition, for the inspective rechargeable battery, the period of time $t_M'$ during which the charge current value becomes to be $I_M$ from $I_0$ in the constant voltage charging mode is measured and the stored electricity quantity $Q_{cv}'$ (=the charged electricity quantity) is obtained. And from the results and the above equations (1), (2) and (3), it is possible to obtain a ratio of the internal resistance of the inspective rechargeable battery at a stored electricity quantity $Q_0'$ to that of the normal rechargeable battery at the stored electricity quantity $Q_0'$.

Here, it can be considered such that a difference between the internal resistance of the inspective rechargeable battery at the stored electricity quantity $Q_0''$ and that of the inspective rechargeable battery at the stored electricity quantity $Q_0'$ is tiny. Therefore, it is also possible to presume that the internal resistance of the inspective rechargeable battery at the stored electricity quantity $Q_0''$ (which is measured) is substantially corresponding to that at the stored electricity quantity $Q_0'$.

Further, it can be considered such that a difference between the ratio (a) of the internal resistance of the inspective rechargeable battery at the stored electricity quantity $Q_0''$ to that of the normal rechargeable battery at the stored electricity quantity $Q_0''$ and a ratio (b) of the internal resistance of the inspective rechargeable battery upon the discharging and that of the normal rechargeable battery upon the discharging is tiny. Therefore, it is possible to presume that the ratio (a) is substantially corresponding to the ratio (b).

Computation of Actuation Duration of Instrument

The detecting method of the present invention can be applied in order to find the actuation duration of an instrument having a rechargeable battery provided therein as a power source. Particularly, for instance, a decrease ratio D in the electricity storable capacity of the rechargeable battery (as the inspective rechargeable battery) provided in the instrument is computed by the previously described method. Presuming that the total discharged electricity quantity of a corresponding normal rechargeable battery (as a reference standard for the inspective rechargeable battery) can be expressed to be $C_d = C_N \times f(i, T)$ from a correction coefficient f(i, T) which is decided by the electricity storable capacity $C_N$, the discharge current i and the battery temperature T of the normal rechargeable battery, when for the instrument in which the inspective rechargeable battery is used as the power source, the average consumption current of the instrument is made to be i, the average consumption power of the instrument is made to be p, and the average battery voltage of the inspective rechargeable battery is made to be Vm, the remaining actuation duration of the instrument h of the instrument is computed in accordance with the equation $h = (D \times C_d)/i$ or $h = (Vm \times D \times C_d)/p$. In the above correction coefficient f(i, T) which is decided by the charge current i and the temperature T of the inspective rechargeable battery, previously measured data obtained using the normal rechargeable battery, function equations obtained on the basis of said data, data or function equations with respect to the charge characteristics of the normal rechargeable battery which are obtained by way of simulation by means of a computer can be selectively used.

The remaining actuation duration h of the instrument can be more precisely computed in accordance with the following equation in which a correction coefficient r which is decided from the information concerning the internal resistance, i.e., a ratio $R_{10}'(Q_0'')/R_{10}(Q_0'')$ of the internal resistance $R_{10}'(Q_0')$ of the inspective rechargeable battery to the internal resistance $R_{10}(Q_0'')$ of the normal rechargeable battery is used.

$$h=(1/r) \times (D \times C_d)/i \text{ or } h=(1/r) \times (Vm \times D \times C_d)/p$$

Detecting Apparatus for Detecting Internal Information of Rechargeable Battery

A typical embodiment of the detecting apparatus of the present invention is a detecting apparatus for detecting internal information of an inspective rechargeable battery when said inspective rechargeable battery is charged by a constant current-constant voltage charging regime in that charging is commenced at a constant current value $I_0$ and after the battery voltage reaches a given voltage value $V_{max}$, the charging is performed at a constant voltage $V_{max}$ until the termination thereof, said detecting apparatus having at least a means for measuring a charge current value I when the inspective rechargeable battery is charged by the constant current-constant voltage charging regime; a means for measuring an elapse of time (t) from the time when a constant current charging mode at a constant current value $I_0$ is shifted to a constant voltage charging mode at a constant voltage $V_{max}$; a means for measuring a time $(t_M')$ when the charge current value in said constant voltage charging mode becomes to be a given current value $I_M$; and an arithmetic means for performing operation using information of said measured charge current value I or said elapse of time (t).

The detecting apparatus of the present invention is preferred to include a memory means. In the memory means, it is preferred that information of the characteristics of a corresponding normal rechargeable battery which is the same as the inspective battery in terms of the type and kind is memorized in advance. From the previously memorized information of the characteristics of the normal rechargeable battery and the measured information of the inspective rechargeable battery, it is possible to obtain internal information of the rechargeable.

In another typical embodiment, the detecting apparatus of the present invention is for detecting internal information of an inspective rechargeable battery when said inspective rechargeable battery is charged by a constant current-constant voltage charging regime, said detecting apparatus having at least a means for measuring a charge current value I when said inspective rechargeable battery is charged by the constant current-constant voltage charging regime; a means for measuring an elapse of time (t) from the time when a constant current charging mode at a constant current value $I_0$ is shifted to a constant voltage charging mode at a constant voltage $V_{max}$; a means for measuring a time $(t_M')$ when the charge current value in said constant voltage charging mode becomes to be a given current value $I_M$; a means for measuring a charged electricity quantity $Q_{vc}'$ in said constant voltage charging mode; a memory means in which an electricity storable capacity (or a nominal capacity) $C_N$ of a corresponding normal rechargeable battery and internal information of said normal rechargeable battery when said normal rechargeable battery is charged by the constant current-constant voltage charging regime are memorized, said internal information including the time $(t_M)$ when the charge current value in the constant voltage charging mode becomes to be a given current value $I_M$ and the charged electricity quantity $Q_{CV}$ in the constant voltage charging mode; and an arithmetic means for computing an electricity storable capacity $(C_N')$ of the inspective rechargeable battery from said $C_N$, $t_M$ and $Q_{VC}$ of the normal rechargeable battery which are memorized in said memory means and said $t_M'$ and $Q_{VC}'$ detected from the inspective rechargeable battery. The computation of the electricity storable capacity is performed by using the previously described equation (1).

In a further typical embodiment, the detecting apparatus of the present invention is for detecting internal information of an inspective rechargeable battery when said inspective rechargeable battery is charged by a constant current-constant voltage charging regime, said detecting apparatus having at least a means for measuring an elapse of time (t) from the time when a constant current charging mode at a constant current value $I_0$ is shifted to a constant voltage charging mode at a constant voltage $V_{max}$; a means for measuring a time $(t_M')$ when the charge current value in said constant voltage charging mode becomes to be a given current value $I_M$; a means for measuring a charged electricity quantity $Q_{vc}'$ in said constant voltage charging mode; a memory means in which an electricity storable capacity (or a nominal capacity) $C_N$ of a corresponding normal rechargeable battery and internal information of said normal rechargeable battery when said normal rechargeable battery is charged by the constant current-constant voltage charging regime are memorized, said internal information including the time $(t_M)$ when the charge current value in the constant voltage charging mode becomes to be a given current value $I_M$ and the charged electricity quantity $Q_{CV}$ in the constant voltage charging mode; and a memory means in which further internal information of the normal rechargeable battery is memorized, said further internal information including a relation formula Voc(Q) of the open-circuit voltage Voc to the stored electricity quantity Q and a relation formula $R_{10}(Q)$ of the internal resistance $R_{10}$ to the stored electricity quantity Q in the constant current charging mode at the constant current value $I_0$; and an arithmetic means for acquiring internal information concerning an electricity storable capacity and internal resistance of the inspective rechargeable battery from said measured information of the inspective rechargeable battery and said memorized information concerning the characteristics of the normal rechargeable battery.

As the relationship Voc(Q) and the relationship $R_{10}(Q)$ of the normal rechargeable battery, data table or function formulas previously acquired using the normal rechargeable battery. In order to acquire internal information concerning the internal resistance of the rechargeable battery, the previously described equations (1), (2) and (3) are used.

The arithmetic means in the detecting apparatus of the present invention is preferred to have a means for processing the basic data and the detected information. It is also preferred for the arithmetic means to have a means capable of computing the time required until the termination of the charging for the inspective rechargeable battery while computing the electricity storable capacity or/and the internal resistance of the inspective rechargeable battery or the remaining actuation duration of an instrument in which the inspective rechargeable battery is used as the power source.

Further, the detecting apparatus of the present invention may have a means for outputting or indicating the information acquired from the measuring means and/or information concerning the acquired internal information of the inspective rechargeable battery.

Examples of the Detecting Apparatus of the Present Invention

Figure 7:
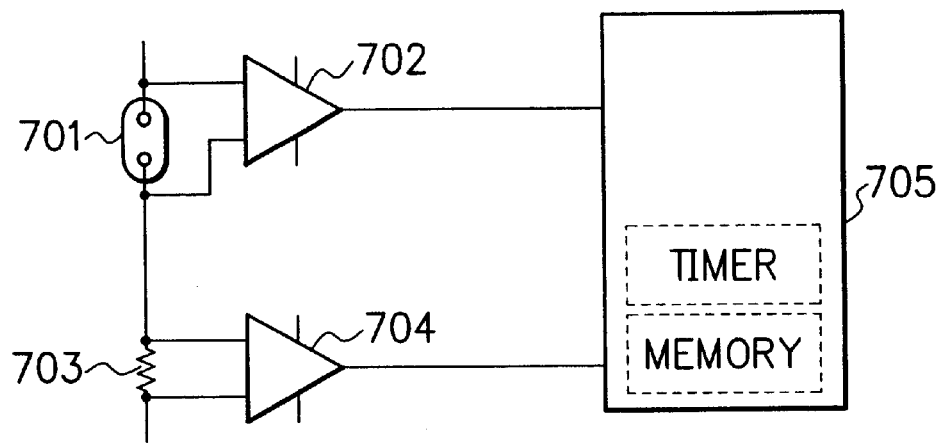
FIG. 7 is a schematic diagram illustrating an example of an electric circuit as a principal constitution portion of a detecting apparatus for detecting internal information of a rechargeable battery in the present invention.

FIG. 7 is a schematic diagram illustrating an example of an electric circuit as a principal constitution portion of the detecting apparatus of the present invention for detecting internal information of a rechargeable battery, including the electricity storable capacity, the internal resistance and the like of the rechargeable battery.

Description will be made of the detecting apparatus shown in FIG. 7.

The electric circuit constitution of the detecting apparatus of the present invention basically comprises a pair of terminals 701 for connecting an inspective rechargeable battery to the apparatus body, a battery voltage-detecting portion 702 for detecting a voltage between a pair of terminals (an inter-terminal voltage) of the rechargeable battery, a current sense resistor 703 for detecting a charge current of the rechargeable battery, an amplifier 704, and a control portion 705. The terminals 701 serve to readily and surely electrically connect the inspective rechargeable battery with the apparatus body.

The battery-voltage detecting portion 702 with a high input impedance serves to detect an inter-terminal voltage between the anode and the cathode of the inspective rechargeable battery, where information of the detected voltage is outputted from the battery-voltage detecting portion 702 into the control portion 705.

The charge current of the inspective rechargeable battery is detected and converted into a voltage signal by the current sense resistor 703, the voltage signal from the current sense resistor 703 is inputted into the amplifier 704 where the voltage signal with current information is amplified, followed by being inputted into the control portion 705.

The control portion 705 has a timer in the inside or the outside thereof. The timer serves to measure a charge duration from the shift time to the constant voltage charging from the constant current charging, and the control portion 705 acquires data of the charge current values to the charge times for the inspective rechargeable battery. The control portion 705 also has a memory in the inside or the outside thereof. The memory serves to memorize said acquired data of the inspective rechargeable battery. In the memory of the control portion 705, it is possible to memorize information of the charge characteristics of a corresponding normal rechargeable battery which is the same as the inspective rechargeable battery in terms of the type and kind, said information including the charge current values to the charge times and the like, and computation equations for acquiring internal information from aforesaid data of the inspective rechargeable battery. It is preferred that the relation formula $Voc(Q)$ of the open-circuit voltage $Voc$ to the stored electricity quantity Q, the relation formula $V_{10}(Q)$ of the battery voltage $V_{10}$ to the stored electricity quantity Q and the relation formula $R_{10}(Q)$ of the internal resistance $R_{10}$ to the stored electricity quantity Q for the normal rechargeable battery are memorized in the memory of the control portion 705 in advance.

In addition, the control portion 705 is preferred to have an arithmetic function to compute internal information concerning the electricity storable capacity, the internal resistance and the like of the inspective rechargeable battery.

It is possible to make the apparatus in this embodiment have a function to indicate a judged result of the remaining lifetime and a time required until the termination of the charging with respect to the inspective rechargeable battery on the basis of the information of the computed electricity storable capacity and the like of the inspective rechargeable battery or a function to indicate the remaining actuation duration of an instrument in which the inspective rechargeable battery is used as the power source.

The electric circuit of the detecting apparatus of the present invention in this embodiment may be singly operated by connecting to the inspective rechargeable battery. For the power source necessitated for the apparatus body at this time, nothing is described in the figure, but it is possible to design such that the power source is supplied from the outside or it is supplied through a regulator.

Figure 8:
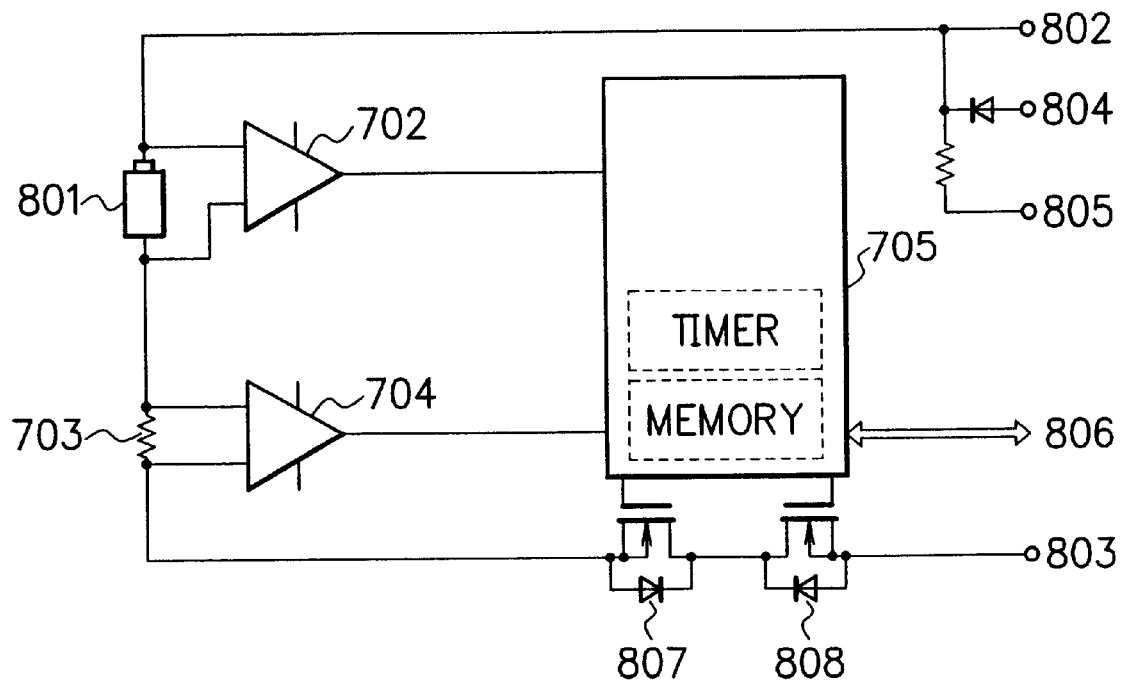
FIG. 8 is a schematic diagram illustrating an example of an embodiment in which a combination of the detecting apparatus having the electric circuit shown in FIG. 7 and a rechargeable battery is installed in a battery pack (module).

FIG. 8 is a schematic diagram illustrating an example of an embodiment in which a combination of the detecting apparatus having the electric circuit shown in FIG. 7 and a rechargeable battery (801) is installed in a battery pack (module).

The circuit constitution of the detecting apparatus shown in FIG. 8 is a partial modification of the circuit constitution shown in FIG. 7. Therefore, here, description will be made of the constitution not shown in FIG. 7.

The circuit constitution shown in FIG. 8 has a positive terminal 802 of the battery module (or the battery pack), a negative terminal 803 of the battery module, a charging positive terminal 804 (the negative terminal 803 is capable of serving also as a charging negative terminal), a battery voltage monitor output terminal 805, and a communication function 806 to an instrument to be connected. If necessary, it is possible to make the control portion 705 of the apparatus in this embodiment to perform an overcharge prevention function 807 or/and an overdischarge prevention function 808 for the rechargeable battery installed in the battery pack. The battery pack shown in FIG. 8 comprises only one rechargeable battery is installed. This is for the simplification purpose and not limitative. The battery pack may comprise a plurality of rechargeable batteries.

By having such communication mechanism 806, the battery pack having the detecting apparatus of the present invention accommodated therein is able to notice information of internal information of the rechargeable battery or battery pack such as the electricity storable capacity, the lifetime, and the like, the time required until the termination of the charging which is computed from said internal information or the remaining actuation duration of the instrument to the instrument connected.

Besides, it is possible that the detecting apparatus of the present invention represented by FIG. 7 is accommodated in an instrument body in which a rechargeable battery is used as a power source. It is also possible to make the control portion of the instrument body have the functions of the detecting apparatus represented by FIG. 7. To be more specific, it is possible that a program based on the detecting method of the present invention is inputted in the control portion of the instrument body so as to have the detecting functions of the present invention. For instance, in the case of a portable type personal computer which is used by connecting a rechargeable battery thereto, the personal computer has a main control portion which is chiefly engaged in operation of the main body and a sub-control portion which is chiefly engaged in communicating with peripheral equipments. In the sub-control portion, information of the electric current or/and the voltage of the rechargeable battery as the power supply source is monitored. In the sub-control portion which acquires the monitored information or the main control portion, by inputting the program of the detecting method of the present invention and necessary basic data of a normal rechargeable battery corresponding to said rechargeable battery, the instrument body is made to have the functions of the detecting apparatus of the present invention, whereby internal information of the rechargeable battery can be always detected and the power source of the instrument body can be controlled at a high precision. This makes it possible that the stored energy of the rechargeable is efficiently utilized and the performance of the instrument is exhibited to the maximum.

Incidentally, it is possible to make the detecting apparatus of the present invention have versatility by inputting information of the characteristics of each of a plurality of normal rechargeable batteries whose kinds are the same but whose types are different one from the other (for instance, a plurality of normal lithium ion rechargeable batteries whose kinds are the same but whose types are different one from the other, a plurality of normal nickel-metal hydride rechargeable batteries whose kinds are the same but whose types are different one from the other, a plurality of normal nickel-cadmium rechargeable batteries whose kinds are the same but whose types are different one from the other, or a plurality of normal lead-acid rechargeable batteries whose kinds are the same but whose types are different one from the other) into the memory means thereof.

In this case, it is preferred that the detecting apparatus is provided with a type selection means for selecting a normal rechargeable battery type which is suitable for detecting internal information of a given inspective rechargeable battery in the detecting apparatus. The type selection means in this case may have, for instance, a switch-inputting function or an inputting function by a wire or radio electric signal or an optical signal. By this, it is possible to readily comply with any case where internal information of a given inspective rechargeable battery comprising a lithium ion rechargeable battery, a nickel-metal hydride rechargeable battery, a nickel-cadmium rechargeable battery, or a lead-acid rechargeable battery is detected.

Memory Medium in Which a Program for Detecting Internal Information of an Inspective Rechargeable Battery is Stored In the memory medium in the present invention, a program obtained by programming the detecting method of the present invention represented by the flow chart shown in FIG. 1 and data of basic characteristics of a normal rechargeable battery as a reference standard for an inspective rechargeable battery are basically memorized.

The memory medium of the present invention can be used in an instrument having a charging function so as to have a function to detect internal information of a rechargeable battery used therein by connecting the memory medium thereto.

Such instrument can include, for example, chargers, video cameras, digital cameras, cellular phones, personal digital assistants, computers, and vehicles such as electric vehicles and hybrid powered automobiles, respectively having a power source comprising a rechargeable battery.

Even in the case where a change is occurred in the type or/and the kind of the rechargeable battery used, correction for the change can be readily performed by providing an adequate memory medium capable of complying with the change, where precise detection of internal information of the rechargeable battery can be performed.

Instruments in Which the Detecting Apparatus of the Present Invention can be Adopted As previously described, the detecting method of the present invention makes it possible to accurately compute the electricity storable capacity of a given inspective rechargeable battery even when the rechargeable battery is a degraded rechargeable battery whose electricity storable capacity is decreased or whose internal resistance is increased. Because of this, for an instrument in which a rechargeable battery is used as the power source, it is possible to accurately distinguish not only the remaining actuation duration of the instrument but also the exchanging time of the rechargeable battery when the lifetime thereof is terminated.

Thus, by mounting the detecting apparatus in which the detecting method for detecting internal information of a rechargeable battery according to the present invention is adopted, the performance of the instrument and that of the rechargeable battery used in the instrument can be maximized.

As such instrument whose performance can be maximized by mounting the detecting apparatus of the present invention therein, there can be mentioned, for example, cellular phones, personal digital assistants, computers, video cameras, digital cameras, and vehicles in which a rechargeable battery is used as the power source such as electric vehicles and hybrid powered automobiles.

Besides, there can be also mentioned battery packs (in which a single rechargeable battery is packaged or a plurality of rechargeable batteries are packaged while being connected in series or parallel connection), and chargers. For such battery pack, it is possible to make the battery pack to have a communication function which communicates internal information of the rechargeable battery with the instrument.

Further, as other instrument (or a system) whose performance can be improved by mounting the detecting apparatus of the present invention therein, there can be mentioned, for example, inspection instruments for inspecting whether a rechargeable battery product is good or not good, and power storage systems.

In the following, the present invention will be described in more detail with reference to experiments and examples. It should be understood that these experiments and examples are only for illustrative purposes and not intended to restrict the scope of the invention.

Experiment 1

Appropriateness of Electricity Storable Capacity Ratio D to Normal Rechargeable Battery Appropriateness of the detecting method of the present invention for detecting internal information of a rechargeable battery is confirmed by an experiment showing a fact in that a charge current curve compensated by an electricity storable capacity ratio D to a normal rechargeable battery intersects with that of the normal rechargeable battery at a current value of ½ the current value in the constant current charging mode.

FIG. 6(1) shows a graph exemplifying charge current changes (or profiles) to charge time changes of each of (a) a commercially available lithium ion rechargeable battery having a diameter of 17 mm, a length of 67 mm, and a nominal capacity of 1300 mAh and (b) an inspective lithium ion rechargeable battery having a diameter of 17 mm, a length of 67 mm, and a nominal capacity of 1300 mAh and whose performance is deteriorated because of repetition of the charge-and-discharge cycle 200 times, when each of them was charged by the constant current-constant voltage charging regime, where the charge current value in the constant current charging was made to be 1 A and the charge voltage value in the constant voltage charging was made to be 4.2 V.

FIG. 6(2) shows a graph of each of the rechargeable batteries (a) and (b) charged as described in FIG. 6(1), exemplifying battery voltage changes to changes in the discharged electricity quantity when each of the rechargeable batteries (a) and (b) was discharged at a low current value of 0.13 A (at which the influence to the internal resistance due to the current density is minimized) until the battery voltage reached 2.75 V.

From FIG. 6(2), there was obtained a finding that in the discharging at the low current value of 0.13 A, the discharged electricity quantity of the inspective rechargeable battery (b) is 0.78 time that of the normal rechargeable battery (a).

It is possible that the discharged electricity quantity of the rechargeable battery at the low current value of 0.13 A is regarded to corresponds an electricity storable capacity of the rechargeable battery. Therefore, it can be said that a electricity storable capacity ratio of the electricity storable capacity of the inspective rechargeable battery (b) to that of the normal rechargeable battery (a) is 0.78.

In FIG. 6(3), a charge current curve obtained by multiplying the charge current curve [shown in FIG. 6(1)] of the inspective rechargeable battery (b) by 1/0.7 times (=1.282 times) in a direction of the charge time axis is shown, together with the charge current curve [shown in FIG. 6(1)] of the normal rechargeable battery (a).

From FIG. 6(3), it is understood that the charge current curve compensated by 1/D time of the inspective rechargeable battery (b) intersects with the charge current curve of the normal rechargeable battery (a) at a current value of 0.5 A which is ½ of the charge current value 1 A in the constant current charging. This indicates that an electricity storable capacity ratio of the electricity storable capacity of a given inspective rechargeable battery to that of a corresponding normal rechargeable battery or the electricity storable capacity of a given inspective rechargeable battery can be obtained by the foregoing equation (1). This also indicates that when the charge current curve of an inspective rechargeable battery whose electricity storable capacity is decreased and whose internal resistance is increased is compensated by multiplying the charge current curve by 1/D time in a direction of the charge time axis, there can be obtained the charge current curve of an inspective rechargeable battery whose internal resistance only is increased.

Experiment 2

Acquisition Example of Basic Data of Characteristics of Normal Rechargeable Battery With reference to FIGS. 9 to 11, description will be made of an example of a method of acquiring data or function formulas for a given normal rechargeable battery (corresponding to a given inspective rechargeable battery) with respect to a relationship of the open-circuit voltage to the stored electricity quantity and with respect to a relationship of the internal resistance to the stored electricity quantity in the constant current charging.

FIG. 9 is a graph showing charge-discharge characteristics of a commercially available lithium ion rechargeable battery having a diameter of 17 mm, a length of 67 mm, and a nominal capacity of 1300 mAh when charging and discharging were performed for the rechargeable battery in the following manner, where the horizontal axis represents charge time and the vertical axis represents battery voltage.

That is, first, the rechargeable battery was charged until the rechargeable battery was full-charged by the constant current-constant voltage charging regime where the constant current charging was performed under conditions of 1 A for the current value and 4.2 V for the maximum voltage value, followed by performing the constant voltage charging. After this, the rechargeable battery was paused for a prescribed period of time, and thereafter, the rechargeable battery was subjected to discharging, where a discharge cycle of subjecting the rechargeable battery to discharging at a discharge current of 0.26 A for 15 minutes (an electricity quantity corresponding to about 5% of the nominal electric capacity of the rechargeable battery is discharged) and pausing the rechargeable battery for a prescribed period of time was repeated until the battery voltage of the rechargeable battery reached 2.75 V.

Figure 10:
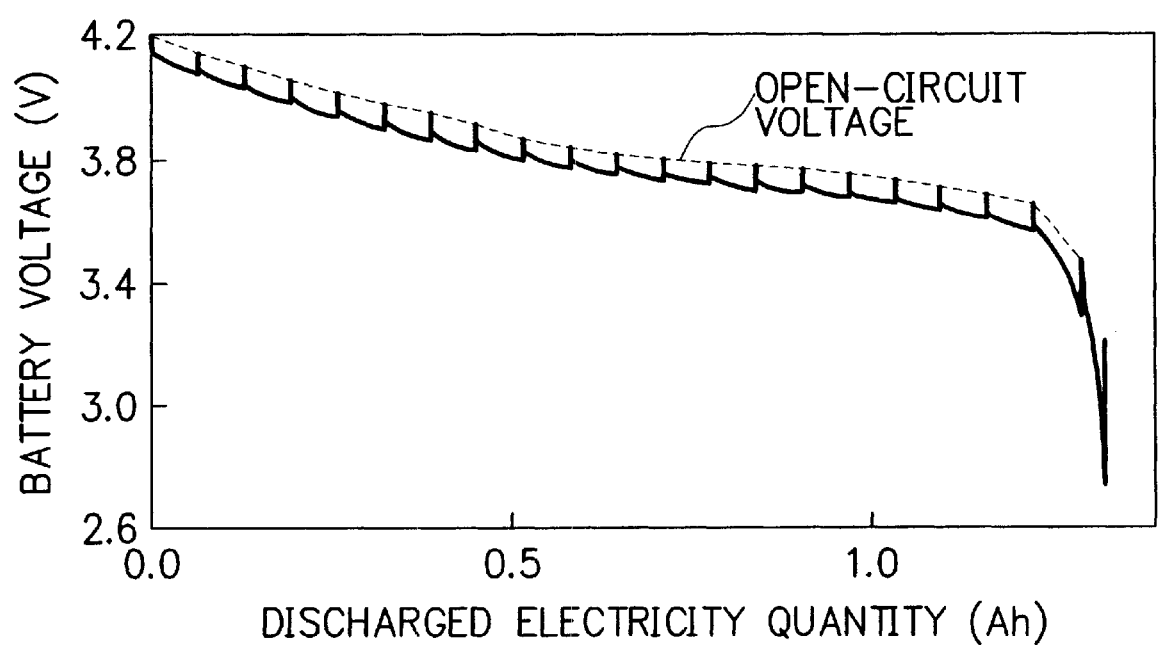
FIG. 10 shows a graph for the results obtained in FIG. 9, exemplifying a relationship between the battery voltages upon the discharging to an integrated discharged electricity quantity from the data upon the discharging and the open-circuit voltages upon pausing the discharging operation.

FIG. 10 is a graph showing relationships of the battery voltages upon the intermittent discharge operations to and the open-circuit voltages upon the pausing times each after the discharge operation to the discharged electricity quantities integrated based on the data upon the discharge operation shown in FIG. 9. In FIG. 10, the broken line shows a traced result of the open-circuit voltages of the rechargeable battery upon the pausing times each after the discharge operation (the intermittent discharge operation) and the solid line shows a traced result of the battery voltages of the rechargeable battery upon the intermittent discharge operations, where each spike portion indicates a point of time when the discharge operation was suspended and the rechargeable battery was paused.

In FIG. 10, the integrated discharged electricity quantity when the battery voltage was suddenly reduced to reach 2.75 V corresponds to an electricity storable capacity which is substantially equal to the nominal capacity of the rechargeable battery. Further in FIG. 10, the point where the integrated discharged electricity quantity is substantially zero indicates that the rechargeable battery is in a full-charged state and has a stored electricity quantity which is substantially equal to the nominal capacity.

Thus, it is understood that the open-circuit voltage curve of the broken line in FIG. 10 shows a relationship of the stored electricity quantity (Q) and the open-circuit voltage (Voc) of the rechargeable battery. The stored electricity quantity corresponds to a value obtained by subtracting the integrated discharged electricity quantity at a given time from the electricity storable capacity (=the integrated discharged electricity quantity until the termination of the discharging).

Here, as an example of the function formula Voc(Q) of an approximate curve with respect to the relationship of the stored electricity quantity Q to the open-circuit voltage Voc, it can be expressed as a function of the stored electricity quantity Q as shown in the following.

$$Voc(Q)=P_n \times Q^n + P_{n-1} \times Q^{n-1} + P_{n-2} \times Q^{n-2} + \ldots + P_1 \times Q^1 + P_0 \times Q^0$$

(where each of $P_n$ to $P_0$ is a constant decided depending on the kind, the type, the nominal capacity, or the like of a rechargeable battery)

In this experiment, presuming that the open-circuit voltage Voc is a six-dimensional polynomial of the stored electricity quantity Q, and from the curve-fittings of the open-circuit voltage curve of FIG. 10 on the basis of the acquired basic data of the commercially available lithium ion rechargeable battery having a diameter of 17 mm, a length of 67 mm, and a nominal capacity of 1300 mAh, a function formula Voc(Q) with respect to the relationship of the open-circuit voltage Voc to the stored electricity quantity Q was computed. The computed function formula Voc(Q) was as shown in the following.

$$Voc(Q)=-5.1539 \times Q^6 + 23.017 \times Q^5 - 40.55 \times Q^4 + 35.748 \times Q^3 - 16.121 \times Q^2 + 3.6098 \times Q + 3.4299$$

Figure 11:
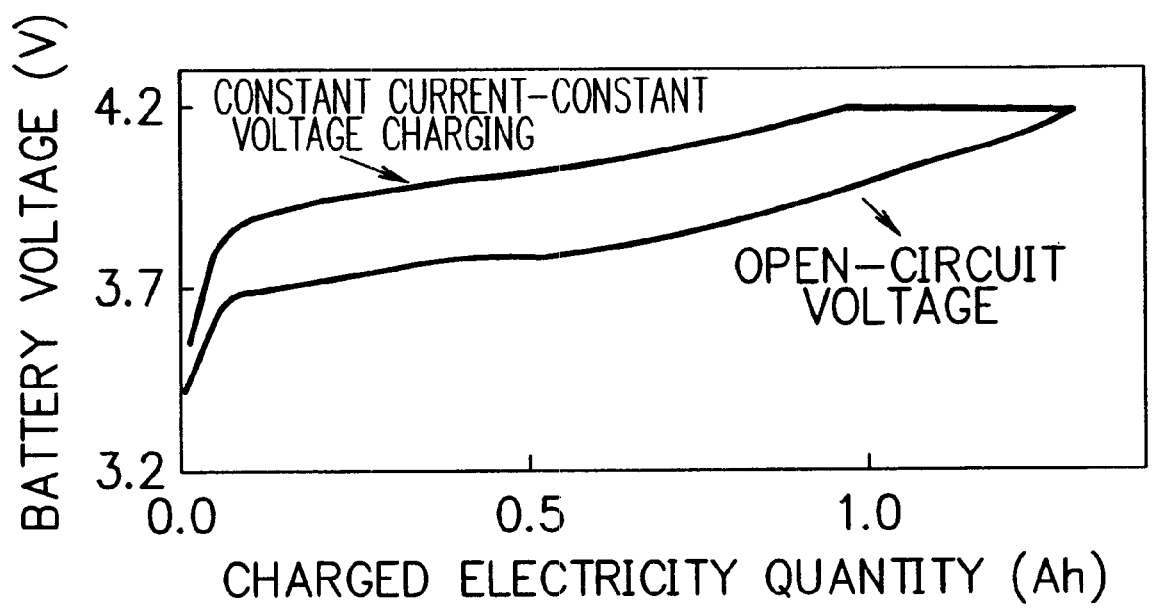
FIG. 11 shows a graph for the results obtained in FIG. 10, exemplifying a relationship between an approximation curve of a relationship of the open-circuit voltage to the presently stored electricity quantities (Q) and changes in the battery voltage when charged by the constant current-constant voltage charging regime (see, FIG. 9).

FIG. 11 shows a graph exemplifying an approximate curve Voc(Q) of the relationships of the open-circuit voltage Voc to the stored electricity quantity Q which were obtained in FIG. 10 and the relationships of the battery voltage V to the charged electricity quantity when charged by the constant current-constant voltage charging regime.

Incidentally, the lithium ion rechargeable battery was found to be of a charge-and-discharge coulomb efficiency which is substantially 100%. Therefore, it can be said that the charged electricity quantity=the stored electricity quantity. In this connection, the discharged electricity quantity in FIG. 10 is a value of [the full-charged electricity quantity—the stored electricity quantity Q] and therefore, a relationship between the stored electricity quantity Q and the open-circuit voltage Voc upon the discharging is agreed with that between the stored electricity quantity Q and the open-circuit voltage Voc upon the charging. More particularly, FIG. 11 shows a graph obtained by plotting the relationships Voc(Q) of the open-circuit voltage Voc to the stored electricity quantity Q which were obtained in FIG. 10 in a graph of the relationships between the charged electricity quantity (=the stored electricity quantity Q) and the battery voltage upon the constant current (1A)-constant voltage (4.2 V) charging.

Separately, FIG. 11 can be also obtained by the same manner in FIG. 10, wherein in the constant current-constant voltage charging, a series of the operations of performing the charging for a prescribed period of time and pausing the charging operation to measure the open-circuit voltage are repeated to obtain relationships of the battery voltage and the open-circuit voltage to the charged electricity quantity.

Incidentally, the measured data are somewhat varied between individuals even when they are of rechargeable batteries which are the same in terms of the type and the kind. Therefore, it is preferred to use averaged data obtained by averaging the measured data obtained from a plurality of rechargeable batteries which are the same in terms of the type and the kind.

As well as in the case of the function formula Voc(Q), for the function formula $V_{I0}(Q)$ of the relationship of the stored electricity quantity Q and the battery voltage $V_{10}$ in the constant current charging region, presuming that the battery voltage $V_{I0}$ is a six-dimensional polynomial of the stored electricity quantity Q, a constant term of the six-dimensional polynomial which is agreed with the battery voltage curve to the stored electricity quantity in the constant current charging region was computed to obtain a function formula $V_{I0}(Q)$.

The resultant function formula $V_{I0}(Q)$ was as shown in the following.

$$V_{I0}(Q) = -61.579 \times Q^6 + 198.46 \times Q^5 - 248.74 \times Q^4 + 153.06 \times Q^3 - 47.891 \times Q^2 + 7.3465 \times Q + 3.505$$

For the function formula $R_{I0}(Q)$, when the stored electricity quantity is Q, the battery voltage is $V_{I0}(Q)$, the open-circuit voltage is Voc(Q), and the battery's internal resistance is $R_{I0}(Q)$ at the time when the constant current charging at the charge current value $I_0$, the following relation formula is expressed.

$$R_{I0}(Q) = \{V_{I0}(Q) - Voc(Q)\}/I_0$$

Therefore, a function formula which expresses the relationship of the internal resistance to the stored electricity quantity can be computed. The computed function formula is as shown in the following.

$$R_{I0}(Q) = -56.4251 \times Q^6 + 175.443 \times Q^5 - 208.19 \times Q^4 + 117.312 \times Q^3 - 31.77 \times Q^2 + 3.7367 \times Q + 0.0756$$

In this experiment, the function formula of each of the Voc(Q), $V_{I0}(Q)$, and $R_{I0}(Q)$ was expressed by the six-dimensional polynomial of the stored electricity quantity Q. But this is not limitative. Particularly, these function formulas indicating the basic data of the rechargeable battery are not limited to such polynomial of n-dimension.

Experiment 3

Judgment of the Present or Absence of Short-Circuit

In this experiment, judgment of whether or not a given inspective rechargeable battery is short-circuited was performed in order to confirm the effectiveness of one of the features of the detecting method of the present invention to judge the presence or absence of short circuit in an inspective rechargeable battery.

Particularly, for a short-circuited lithium ion rechargeable battery having a diameter of 14 mm and a length of 50 mm as the inspective rechargeable battery, there were obtained (i) the charge current curve and (ii) the battery voltage curve when the inspective rechargeable battery was charged by the constant current-constant voltage charging regime and (iii) a change with an elapse of time in the open-circuit voltage upon the pausing time.

And the measured data of the inspective rechargeable battery were compared with the previously acquired measured data with respect to the three items (i) to (iii) of a normal lithium ion rechargeable battery having a diameter of 14 mm and a length of 50 mm which is not short-circuited as a reference standard to the inspective rechargeable battery.

FIG. 12(1) is a graph of (a) the normal rechargeable battery and (b) the short-circuited inspective rechargeable battery when each of the two rechargeable batteries (a) and (b) was charged by the constant current-constant voltage charging regime, exemplifying a relationship of changes in the charge current value to charge time changes for the two rechargeable batteries (a) and (b).

FIG. 12(2) is a graph of (a) the normal rechargeable battery and (b) the short-circuited inspective rechargeable battery when each of the two rechargeable batteries (a) and (b) was charged by the constant current-constant voltage charging regime, exemplifying a relationship of changes in the battery voltage value to charge time changes for the two rechargeable batteries (a) and (b).

In FIG. 12(1), with paying attention to the charge current value in the constant voltage charging mode, the following facts are understood. That is, in the case of the normal rechargeable battery, the charge current value is decreased as the charge time proceeds and at the time when the charge time reaches 3 hours, the charge current is stopped flowing and it is likely to converge to zero. On the other hand, in the case of the inspective rechargeable battery, the charge current value is not decreased to such an extent as in the case of the normal rechargeable battery and it is not likely to converge to zero, and there are observed several points where the change $\Delta I/\Delta t$ in the charge current value with respect to the charge time becomes to be a positive value.

From FIG. 12(2), the following facts are understood. That is, in the case of the normal rechargeable battery, the period of time until the shift time to the constant voltage charging mode is relatively short. On the other hand, in the case of the inspective rechargeable battery, the period of time until the shift time to the constant voltage charging mode is relatively long and the increase in the battery voltage is slow, and there are observed several points where the change $\Delta I/\Delta t$ in the charge current value with respect to the charge time becomes to be a negative value.

FIG. 12(3) is a graph of (a) the normal rechargeable battery and (b) the short-circuited rechargeable battery when each of the two rechargeable batteries (a) and (b) was charged by the constant current-constant voltage charging regime and maintained in a paused state without performing the charging operation and the discharging operation, exemplifying a relationship of changes in the open-circuit voltage to an elapsed time of the paused state for the two rechargeable batteries (a) and (b).

From FIG. 12(3), the following facts are understood. That is, in the case of the normal rechargeable battery, there is substantially no change in the open-circuit voltage to the elapsed time of the paused state. On the other hand, in the case of the inspective rechargeable battery, there are decreases in the open-circuit voltage to the elapsed time of the paused state.

From the above-described results, it is understood that the detecting method of the present invention is effective in judging whether or not an inspective rechargeable battery is short-circuited.

In the following, the features and advantages of the present invention will be described with reference to examples. It should be understood that these examples are only for the illustrative purpose and not intended to restrict the scope of the present invention.

EXAMPLE 1

In this example, the effectiveness of the detecting method of the present invention was examined by a manner wherein an inspective rechargeable battery whose electricity storable capacity is degraded as a result of repetition of the charge-and-discharge cycle is first estimated by the detecting method of the present invention, then the electricity storable capacity is obtained from the practical discharged electricity quantity, followed by subjecting to comparison. To be more specific, in accordance with the flow chart shown in FIG. 1, the procedures were performed until Step 10, where an electricity storable capacity ratio was obtained, and thereafter, a practical discharged electricity quantity was measured.

Particularly, there were provided two commercially available lithium ion rechargeable batteries (a) and (b) having a diameter of 17 mm, a length of 67 mm and a nominal capacity of 1300 mAh.

Of these two rechargeable batteries, the rechargeable battery (a) was confirmed that it was not short-circuited, from a confirmed change magnitude with an elapse of time in the open-circuit voltage.

Then, the rechargeable battery (a) was charged by the constant current-constant voltage regime, where the rechargeable battery was charged at a constant current value of 1 A until the battery voltage reached 4.2 V, and thereafter, the rechargeable battery was charged at a constant voltage of 4.2 V until the total charging time became to be 2.5 hours, wherein a period of time $t_M$ from the shift time to the constant voltage charging with 4.2 V until the charge current value became to be 0.5 A and an electricity quantity $Q_{cv}$ charged by the constant voltage charging with 4.2 V were measured. Here, from the change with an elapse of time in the current value in the constant voltage charging mode, the rechargeable battery (a) was confirmed that it was not short-circuited.

Then, the rechargeable battery (a) was discharged at a constant current value of 0.13 A until the battery voltage reached 2.75 V, and a charged electricity quantity of the rechargeable battery at this time was measured. The charged electricity quantity was found to be 1303.5 mAh which substantially agrees with the nominal capacity value. Thus, it was possible to consider that the charged electricity quantity of 1303.5 mAh is the electricity storable capacity of the rechargeable battery (a) and the rechargeable battery (a) belongs to a normal rechargeable battery. Separately, the above period of time $t_M$ was 755 seconds and the above charged electricity quantity $Q_{cv}$ was 339.9 mAh.

Now, the rechargeable battery (b) was subjected to a charge-and-discharge cycle test. Particularly, a cycle wherein as a first step, the rechargeable battery is charged by the constant current-constant voltage regime, where after the rechargeable battery is charged at a constant current value of 1 A until the battery voltage reaches 4.2 V, the rechargeable battery is charged at a constant voltage of 4.2 V until the total charging time becomes to be 2.5 hours and as a second step, the rechargeable battery is discharged at a constant current value of 0.65 A until the battery voltage reaches 2.75 was repeated 200 times. The rechargeable battery (b) thus cycle-degraded was made to be an inspective rechargeable battery (b') for detecting an electricity storable capacity.

The inspective rechargeable battery (b') was confirmed that it was not short-circuited, from a confirmed change magnitude with an elapse of time in the open-circuit voltage. Then in order to compute an electricity storable capacity ratio of the electricity storable capacity of the inspective rechargeable battery (b') to that of the rechargeable battery, the following procedures were performed for the inspective rechargeable battery (b').

Particularly, the inspective rechargeable battery (b') was charged by the constant current-constant voltage regime, where the rechargeable battery was charged at a constant current value of 1 A until the battery voltage reached 4.2 V, and thereafter, the rechargeable battery was charged at a constant voltage of 4.2 V until the total charging time became to be 2.5 hours, wherein a period of time $t_M'$ from the shift time to the constant voltage charging with 4.2 V until the charge current value became to be 0.5 A and an electricity quantity $Q_{cv}'$ charged by the constant voltage charging with 4.2 V were measured. And an electricity storable capacity ratio D of the electricity storable capacity of the inspective rechargeable battery (b') to that of the above-described rechargeable battery (a) (which was previously confirmed to be normal) was computed from the foregoing equation (1).

Here, the above period of time $t_M'$ was 2341 seconds and the above charged electricity quantity $Q_{cv}'$ was 754.9 mAh. And from the change with an elapse of time in the current value in the constant voltage charging mode, the inspective rechargeable battery (b') was confirmed that it was not short-circuited.

Thereafter, the inspective rechargeable battery (b') was discharged at a constant current value of 0.13 A (substantially corresponding to 0.1 C) until the battery voltage reached 2.75 V, and a discharged electricity quantity of the inspective rechargeable battery at this time was measured. The discharged electricity quantity obtained was considered to be the electricity storable capacity of the inspective rechargeable battery (b'). The discharged electricity quantity was found to be 1015.4 mAh.

The results obtained in the above are collectively shown in Table 1.

Now, the electricity storable capacity ratio D of the electricity storable capacity of the inspective rechargeable battery (b') to that of the normal rechargeable battery (a) can be expressed by the following equation (1).

$$D=(Q_{cv}'-I_0 \times t_M')/(Q_{cv}-I_0 \times t_M) \qquad (1)$$

In the equation (1), $I_0=1$ A, $t_M$ is the period of time from the shift time to the constant voltage charging with 4.2 V until the charge current value became to be 0.5 A with respect to the normal rechargeable battery (a), $t_M'$ is the period of time from the shift time to the constant voltage charging with 4.2 V until the charge current value became to be 0.5 A with respect to the inspective rechargeable battery (b'), $Q_{cv}$ is the electricity quantity charged by the constant voltage charging with 4.2 V with respect to the normal rechargeable battery (a), and $Q_{cv}'$ is the electricity quantity charged by the constant voltage charging with 4.2 V with respect to the inspective rechargeable battery (b').

From the results shown in Table 1, an erroneous difference between the measured value and the computed value with respect to the electricity storable capacity ratio can be computed by the following equation.

$$\{[0.799-0.779]/0.779\}\times 100 =2.5\%$$

That is, the above erroneous difference was found to be 2.5%.

Separately, because the D value (that is, an electricity storable capacity ratio of the electricity storable capacity of a given inspective rechargeable battery to that of a corresponding normal rechargeable battery as a standard reference for inspective rechargeable battery) can be computed as above described, when the nominal capacity of the normal rechargeable battery is previously known, the electricity storable capacity can be readily computed from the D value.

As will be understood from the above description, according to the detecting method of the present invention, the electricity storable capacity of a rechargeable battery whose electricity storable capacity is unknown can be readily computed at a good precision from a measured value of the charge current in the constant voltage charging region of the constant current-constant voltage charging without subjecting the rechargeable battery to the discharging.

EXAMPLE 2

This example is of continuance from Example 1. To be more specific, the procedures of Step 11 in the flow chart shown in FIG. 1 were performed by using the rechargeable battery (a) as the normal rechargeable batter and the cycle-degraded rechargeable battery (b') as the inspective rechargeable battery, where using the previously acquired basic data of the normal rechargeable battery (a) and the measured data of the current value in the constant voltage charging mode upon the constant current-constant voltage charging with respect to the inspective rechargeable battery (b'), information concerning the internal resistance of the inspective rechargeable battery (b') was obtained, a discharged quantity of the inspective rechargeable battery (b') at a high discharge current value of 1C was estimated, and the estimated discharged quantity was compared with a practical discharged quantity of the inspective rechargeable battery (b').

The estimation of the discharged quantity was performed in a manner described below.

The stored electricity quantity $Q_0$ of the normal rechargeable battery (a) at the shift time to the constant voltage charging with the constant voltage $V_{max}$ from the constant current charging with the constant current value $I_0$ was obtained from the following equation.

[the stored electricity quantity $Q_0$ in the constant current charging]=[the nominal capacity]−[the charged electricity quantity $Q_{cv}$ in the constant voltage charging]

Here, the stored electricity quantity $Q_0$ can also obtained when instead of [the nominal capacity], the total discharged quantity when discharged at the constant current value 0.13 A from the full-charged is used.

Then, the stored electricity quantity $Q_0'$ of the inspective rechargeable battery (b') at the shift time to the constant voltage charging with the constant voltage $V_{max}$ from the constant current charging with the constant current value $I_0$ was obtained from the following equation (2).

$$Q_0'/D=Q_0'=Q_0-I_0\times(t_M'/D-t_M) \quad (2)$$

$t_M$ and $t_M'$ are respectively the period of time from the shift time to the constant voltage charging with 4.2 V until the charge current value became to be 0.5 A with respect to the normal rechargeable battery (a) and the inspective rechargeable battery (b') as described in Example 1.

With respect to the normal rechargeable battery (a), the function formula Voc(Q) of the approximate curve of the relationship of the open-circuit voltage Voc to the stored electricity quantity Q, the function formula $V_{I0}(Q)$ of the relationship of the battery voltage $V_{I0}$ to the stored electricity quantity Q in the constant current charging region, and the function formula $R_{Id}(Q)$ of the relationship of the internal resistance $R_{Id}$ to the stored electricity quantity Q upon the discharging at a discharge current value of 1.3 A were obtained in advance.

Further, a ratio γ of the internal resistance $R_{I0}'$ of the inspective rechargeable battery (b') to that $R_{I0}$ of the normal rechargeable battery (a) was obtained by the following equation (3).

$$\gamma=R_{I0}'(Q'')/R_{I0}(Q_0')=\{V_{max}-Voc(Q')\}/\{I_0\times R_{I0}(Q)\} \quad (3)$$

In the equation (3), $V_{max}=4.2$ V, $I_0=1$ A

The battery voltage $V_d(Q)$ of the normal rechargeable battery (a) upon the discharging with current value of 1.3 A can be expressed by the following function formula concerning the open-circuit voltage Voc(Q) and the internal resistance $R_{Id}(Q)$ upon the discharging which were previously obtained.

$$V_d(Q)=Voc(Q)-I_d\times R_{Id}(Q)$$

Here, when the value of the battery voltage becomes to be 2.75 V (at which the battery voltage is suddenly decreased) at $I_d=1.3$ A, there is established the following equation.

$$2.75=Voc(Q)-1.3\times R_d(Q)$$

By this equation, the stored electricity quantity Q at this time can be computed. And the discharged quantity until when the battery voltage became to be the 2.75 V can be computed by the following equation.

[the discharged quantity at 1.3 A]=[the nominal capacity] −[the stored electricity quantity]

The nominal capacity here can be replaced by the total discharged quantity upon the discharging at the discharge current value of 0.13 A.

Supposing that the electricity storable capacity of the inspective rechargeable battery (b') has not been decreased [this inspective rechargeable battery will be hereinafter referred to as "inspective rechargeable battery (b")], the battery voltage $V_d'(Q)$ thereof can be expressed by the following equation concerning the open-circuit voltage Voc (Q) of the normal rechargeable battery (a) and the internal resistance $R_{Id}'$ of the inspective rechargeable battery upon the discharging.

$$V_d'(Q)=Voc(Q)-I_d\times R_{Id}'(Q)$$

Supposing that the foregoing ratio γ concerning the internal resistance is not changed also upon the discharging, there are established the following equations.

$$R_{Id}'(Q)=\gamma \times R_{Id}(Q) \text{ and } V_d'(Q)=Voc(Q)-I_d \times \gamma \times R_{Id}(Q)$$

When the value of the battery voltage becomes to be 2.75 V at $I_d$=1.3 A, there is established the following equation.

$$2.75=Voc(Q')-1.3\times\gamma\times R_d(Q')$$

By this equation, the stored electricity quantity Q' of the inspective rechargeable battery (b") at this time can be computed. And the discharged quantity of the inspective rechargeable battery (b') until when the battery voltage became to be the 2.75 V can be computed by the following equation.

[the discharged quantity at 1.3 A]=[the nominal capacity]−[the stored electricity quantity]

However, in fact, the inspective rechargeable battery (b') is of the decreased electricity storable capacity and therefore, the electricity storable capacity thereof is D time that of the normal rechargeable battery (a) as previously computed. And the discharged quantity of the inspective rechargeable battery (b') at the discharge current value of 1.3 A can be estimated to be D time that of the inspective rechargeable battery (b").

Now, a practical discharged quantity of the inspective rechargeable battery (b') at the discharge current value of 1.3 A measured, and the measured discharged quantity was compared with the estimated discharged quantity.

The results obtained in the above are collectively shown in Table 2.

From the results shown in Table 2, an erroneous difference between the measured discharged quantity and the the estimated discharged quantity can be computed by the following equation.

{([the measured discharged quantity]−[the estimated discharged quantity])/[the measured discharged quantity]}×100, namely, {(945−919)/919}×100 =2.8%

That is, the above erroneous difference was found to be 2.8%.

In consequence, the following facts are understood. According to the detecting method of the present invention, internal information concerning the internal resistance of an inspective rechargeable battery can be obtained at a considerably high precision. And from the acquired internal information concerning the internal resistance, the discharged quantity of the inspective rechargeable battery can be estimated.

Separately, internal information concerning the internal resistance of an inspective rechargeable battery can be obtained by such a manner as will be described below, which is different from the above-described manner.

In the case where the constant voltage charging curve of a corresponding normal rechargeable battery (as a reference standard for the inspective rechargeable battery) when a resistor is connected thereto in series connection has been acquired as the foregoing equation (7), the internal resistance of the inspective rechargeable battery can be obtained from the equation (7). To more specific, explaining with reference to the normal rechargeable battery (a) and the inspective rechargeable battery (b') in Example 1, when a value of $t_M'/D$ (=$t_M''$) obtained from the electricity storable capacity reduction coefficient D and the time $t_M'$ when the current value reached ½ of the current value in the constant current charging with respect to the inspective rechargeable battery (b') is substituted in the time t of the equation (7), there is obtained a current value corresponding to ½ of the current value in the constant current charging, that is, 0.5 A. Therefore, a resistance value $r_s$ which corresponds to an increased resistance magnitude from the normal rechargeable battery (a) is computed. Here, when the internal resistance value $R_0$ of the normal rechargeable battery has been acquired in advance, the internal resistance value of the inspective rechargeable battery (b') becomes to be $R_0+r_s$. Thus, information concerning the internal resistance of the inspective rechargeable battery can be obtained.

EXAMPLE 3

In this example, the procedures of Example 1 were repeated except for the following point.

The rechargeable battery (b) was degraded by maintaining it in an atmosphere with 70° C. for one week. The rechargeable battery thus degraded was made to be an inspective rechargeable battery (c).

The inspective rechargeable battery (c) was confirmed that it was not short-circuited, from a confirmed change magnitude with an elapse of time in the open-circuit voltage. The inspective rechargeable battery (c) was charged by the constant current-constant voltage regime, where the rechargeable battery was charged at a constant current value of 1 A until the battery voltage reached 4.2 V, and thereafter, the rechargeable battery was charged at a constant voltage of 4.2 V until the total charging time became to be 2.5 hours, wherein a period of time $t_M'$ from the shift time to the constant voltage charging with 4.2 V until the charge current value became to be 0.5 A and an electricity quantity $Q_{cv}'$ charged by the constant voltage charging with 4.2 V were measured.

From the change with an elapse of time in the current value in the constant voltage charging mode, the inspective rechargeable battery (c) was confirmed that it was not short-circuited.

Then, on the basis of the measured values of the normal rechargeable battery (a) in Example 1, a reduction ratio of the electricity storable capacity of the inspective rechargeable battery (c) to that of the normal rechargeable battery (a) was computed.

Thereafter, the inspective rechargeable battery (c) was discharged at a constant current value of 0.13 A until the battery voltage reached 2.75 V, and a charged electricity quantity of the inspective rechargeable battery at this time was measured. The charged electricity quantity obtained was made to be the electricity storable capacity of the inspective rechargeable battery (c).

The results obtained in the above are collectively shown in Table 3.

From the results shown in Table 3, an erroneous difference between the measured value and the computed value with respect to the electricity storable capacity ratio can be computed by the following equation.

{[0.987−0.969]/0.987}×100 =1.8%

That is, the above erroneous difference was found to be 1.8%.

Separately, according to the detecting method of the present invention, from the D value computed (see, Example 1), the electricity storable capacity of a given inspective rechargeable battery can be computed when the nominal capacity of a corresponding normal rechargeable battery (as a reference standard for the inspective rechargeable battery) is previously known. Further, according to the detecting method of the present invention, the electricity storable capacity of a rechargeable battery whose electricity storable capacity is unknown can be readily computed at a good precision from a measured value of the charge current in the constant voltage charging region of the constant current-constant voltage charging without subjecting the rechargeable battery to the discharging.

EXAMPLE 4

In this example, for the inspective rechargeable battery (c) used in Example 3, internal information thereof concerning the internal resistance was acquired and a discharged quantity of the inspective rechargeable battery at a constant discharge current of 1 C (that is, 1.3 A) was estimated in the same manner as in Example 2. The estimated discharged quantity was compared with a measured discharged quantity of the inspective rechargeable battery.

The results obtained in this example are collectively shown in Table 4.

From the results shown in Table 4, an erroneous difference between the estimated discharged quantity and the measured discharged quantity of the inspective rechargeable battery can be computed by the following equation.

{([the estimated discharged quantity]−[the measured discharged quantity])/[the estimated discharged quantity]}×100, namely, {(1246−1234)/1246}×100=1.0%

That is, the above erroneous difference was found to be 1.0%.

In consequence, it is understood that according to the detecting method of the present invention, internal information of an inspective rechargeable battery which concerns the internal resistance can be acquired at a good precision and from said information concerning the internal resistance, a highly precise discharged quantity of the inspective rechargeable battery can be estimated.

From the evaluated results in Examples 1 to 4, the following facts are understood. That is, according to the inspecting method of the present invention, internal information of a given inspective rechargeable battery which concerns the electricity storable capacity and internal resistance thereof can be readily acquired. And from this, a practical discharged quantity of the inspective rechargeable battery can be estimated at a high precision and the remaining lifetime of the inspective rechargeable battery can be estimated. Further, by the highly precise estimation of the electricity storable capacity or the discharged quantity of the inspective rechargeable battery, it is possible to precisely detect the remaining actuation duration of an instrument in which the inspective rechargeable battery is used as the power source.

Incidentally, in Examples 1 to 4, the commercially available lithium ion rechargeable batteries of one kind have used, but this is not limitative. Any other rechargeable batteries of various kinds or various types can be used for the detection of their internal information by the detecting method of the present invention as long as they are capable of being charged by the constant current-constant voltage charging regime. Further, Examples 1 to 4, examples for detecting internal information of the single cells have described. But this is not limitative. Also for various battery packs in which a plurality of cells are connected in series connection, in parallel connection or in series and parallel connections, according to the detecting method of the present invention, their internal information can be detected on the basis of previously acquired data of corresponding normal battery packs capable of being reference standards for them.

As will be understood from the above details, according to the detecting method of the present invention, highly precise internal information of a given inspective rechargeable battery can be detected from the measurement of the charge current value in the constant voltage charging mode of the constant current-constant voltage charging regime by a simple manner. And by this detection of the internal information of the battery, the control of the power source of an instrument including a machine apparatus in which a rechargeable battery is used as the power source can be readily performed, and the remaining actuation duration of the instrument, the timing of the charging and the timing necessary to exchange the battery can be readily found in advance. Thus, by adding the detecting apparatus of the present invention for detecting internal information of a rechargeable battery in which the detecting method of the present invention used to a battery pack, a charger, or an instrument including a machine apparatus in which a rechargeable battery is used as the power source, not only the performance of the rechargeable battery can be optimized but also the performance of such instrument can be optimized. Further, by adding the detecting apparatus of the present invention to an inspection instrument for inspecting a rechargeable battery whether or not it is good or defective prior to shipping it, highly precise shipment inspection can be performed.

TABLE 1

| | battery (normal) with no repetition of charge-and-discharge cycle | battery (degraded) after repetition of 200 charge-and-discharge cycles |
| --- | --- | --- |
| time period reached 0.5 A $t_M$, $t_M'$ (second) | 753 | 2341 |
| charged electricity quantity with constant voltage $Q_{cv}$, $Q_{cv}'$ (mAh) | 340 | 755 |
| D (computed value) | 1.0 | 0.799 |
| total discharged quantity | 1304 | 1015 |
| total discharged quantity ratio (= electricity storable capacity ratio) | 1.0 | 0.779 |

TABLE 2

| | inspective battery |
| --- | --- |
| electricity storable capacity ratio D | 0.779 |
| stored electricity quantity $Q_0''$ by constant current charging | 345 |
| $\gamma = R_{I0}'(Q_0'')/R_{I0}(Q_0'')$ | 2.09 |
| predicted discharged quantity at 1.3 A (mAh) | 945 |
| measured discharged quantity at 1.3 A (mAh) | 919 |

TABLE 3

| | battery (normal) with no repetiton of charge-and-discharge cycle | inspective battery (degraded) after preservation at 70° C. for one week |
|---|---|---|
| time period reached 0.5 A $t_M$, $t_M'$ (second) | 753 | 1723 |
| charged electricity quantity with constant voltage $Q_{cv}$, $Q_{cv}'$ (mAh) | 340 | 605 |
| D (computed value) | 1.0 | 0.969 |
| total discharged quantity | 1304 | 1287 |
| total discharged quantity ratio (= electricity storable capacity ratio) | 1.0 | 0.987 |

TABLE 4

| | inspective battery |
|---|---|
| electricity storable capacity ratio D | 0.969 |
| stored electricity quantity $Q_0''$ by constant current charging | 695 |
| $\gamma = R_{I0}'(Q_0'')/R_{I0}(Q_0'')$ | 1.59 |
| predicted discharged quantity at 1.3 A (mAh) | 1234 |
| measured discharged quantity at 1.3 A (mAh) | 1246 |

What is claimed is:

1. A detecting method for detecting internal information of an inspective rechargeable battery when said inspective rechargeable battery is charged by a constant current-constant voltage charging regime in that charging is commenced at a constant current value $I_0$ and after the battery voltage of said rechargeable battery reaches a given voltage value $V_{max}$, the charging is performed at a constant voltage $V_{max}$ until the termination thereof, said detecting method comprising at least:

a step (A) of measuring an elapse of time (t) from the time when a constant current charging mode at a constant current value $I_0$ is shifted to a constant voltage charging mode at a constant voltage $V_{max}$ and measuring a charge current value I in the constant voltage charging mode;

a step (B) of obtaining a period of time from said shift time to the constant voltage charging in the constant voltage charging mode until the time when said charge current value I in the constant voltage charging mode reaches a given current value $I_M$; and a step (C) of obtaining an electricity quantity charged in the constant voltage charging mode with respect to the inspective rechargeable battery.

2. The detecting method according to claim 1 which further includes a step (D) of referring to charge current characteristics of a corresponding normal rechargeable battery as a reference standard for the inspective rechargeable battery in the constant voltage charging mode when said normal rechargeable battery is charged by the constant current-constant voltage charging regime, said charge current characteristics including relationships $I_N(t)$ of a charge current value $I_N$ to a constant voltage charging time t.

3. The detecting method according to claim 1 or 2, wherein the internal information detected includes the presence or absence of short circuit, electricity storable capacity, internal resistance, charged electricity quantity, remaining capacity (=presently stored electricity quantity= dischargeable capacity) respectively of the inspective rechargeable battery, presently residual electricity quantity with which the inspective rechargeable battery is still capable of being used, and a combination of these items.

4. The detecting method according to claim 1, wherein when the charge current value takes a positive value when the charge time in the constant voltage charging mode becomes infinite, the inspective rechargeable battery is judged to be short-circuited.

5. The detecting method according to claim 1, wherein when the charge current value converges to substantially zero when the charge time in the constant voltage charging mode becomes infinite, the inspective rechargeable battery is judged to be not short-circuited.

6. The detecting method according to claim 4, wherein from a change in the charge current value in the constant voltage charging mode, a converged value of the charge current value when the charge time is infinitely elapsed is computed.

7. The detecting method according to claim 2, wherein the relationships $I_N(t)$ include previously measured data of the normal rechargeable battery, function formulas obtained from said measured data, and function formulas based on said measured data which are obtained by way of simulation by a computer.

8. The detecting method according to claim 1 or 2, wherein the charging is terminated when the charge current value in the constant voltage charging mode becomes less than a given current value $I_{min}$ or when a given period of time $t_f$ elapses from the commencement of the charging.

9. The detecting method according to claim 1 or 2 which further includes a step (E) of judging whether or not the inspective rechargeable battery is short-circuited.

10. The detecting method according to claim 1, wherein the electricity quantity charged in the constant voltage charging mode is an electricity quantity charged until the time when the charging is terminated or an electricity quantity charged until the time when the current value becomes substantially zero.

11. The detecting method according to claim 10, wherein the electricity quantity charged until the time when the current value becomes substantially zero is a value extrapolated from a change in the charge current value in the constant voltage charging mode or a value computed from said change.

12. The detecting method according to claim 2, wherein the inspective rechargeable battery is an inspective rechargeable battery which is not short-circuited; and when with respect to the inspective rechargeable battery, the period of time from the time when the charging at the constant current value $I_0$ is shifted to the charging at the constant voltage $V_{max}$ until the current value becomes the given current value $I_M$ is $t_M'$, and with respect to the normal rechargeable battery, the period of time from the time when the charging at the constant current value $I_0$ is shifted to the charging at the constant voltage $V_{max}$ until the current value becomes the given current value $I_M$ is $t_M$; the inspective rechargeable battery is judged as follows:

(i) when $(t_M'-t_M)>a>0$ (with a being a constant decided by the kind of the rechargeable battery), the inspective rechargeable battery has a greater internal resistance than that of the normal rechargeable battery, and (ii) when $(t_M-t_M')>b>0$ (with b being a constant decided by the kind of the rechargeable battery), the inspective rechargeable battery has a smaller electricity storable capacity than that of the normal rechargeable battery.

13. The detecting method according to claim 2, wherein the inspective rechargeable battery is an inspective rechargeable battery which is not short-circuited; and when the electricity quantity charged at the constant voltage $V_{max}$ in the constant voltage charging mode with respect to the inspective rechargeable battery is $Q_{cv}'$ and the electricity quantity charged at the constant voltage $V_{max}$ in the constant voltage charging mode with respect to the normal rechargeable battery is $Q_{cv}$; the inspective rechargeable battery is judged as follows:

(iii) when $(Q_{cv}'-Q_{cv})>c>0$ (with c being a constant decided by the kind of the rechargeable battery), the inspective rechargeable battery has a greater internal resistance than that of the normal rechargeable battery, and (iv) when $(Q_{cv}\times Q_{cv}')>d>0$ (with d being a constant decided by the kind of the rechargeable battery), the inspective rechargeable battery has a smaller electricity storable capacity than that of the normal rechargeable battery.

14. The detecting method according to claim 2, wherein the inspective rechargeable battery is an inspective rechargeable battery which is not short-circuited and whose electricity storable capacity is presumably decreased by D time (with D being a constant of $0<D\leq 1$) that of the normal rechargeable battery; and when with respect to the inspective rechargeable battery, the period of time from the time when the charging at the constant current value $I_0$ is shifted to the charging at the constant voltage $V_{max}$ until the current value becomes the given current value $I_M$ is $t_M'$ and the electricity quantity charged at the constant voltage $V_{max}$ in the constant voltage charging mode is $Q_{cv}'$, and with respect to the normal rechargeable battery, the period of time from the time when the charging at the constant current value $I_0$ is shifted to the charging at the constant voltage $V_{max}$ until the current value becomes the given current value $I_M$ is $t_M$ and the electricity quantity charged at the constant voltage $V_{max}$ in the constant voltage charging mode is $Q_{cv}$; the inspective rechargeable battery is judged to have an electricity storable capacity which is D time that of the normal rechargeable battery from the following equation (1):

$$D=(Q_{cv}'-I_0\times t_M')/(Q_{cv}-I_0\times t_M) \quad (1).$$

15. The detecting method according to claim 14, wherein the electricity storable capacity of the inspective rechargeable battery is computed to be $C'=C\times D$ from the electricity storable capacity C of the normal rechargeable battery.

16. The detecting method according to claim 9, wherein the inspective rechargeable battery is judged to be not short-circuited or short-circuited by detecting an internal state thereof when said rechargeable battery is charged, discharged or paused without performing the charging or the discharging.

17. The detecting method according to claim 16, wherein the inspective rechargeable battery is judged to be not short-circuited or short-circuited by referring to at least one kind of a factor selected from the group consisting of an increase rate in the battery voltage upon the constant current charging mode, a decrease rate in the charge current upon the constant voltage charging mode, a decrease rate in the battery voltage upon the discharging, and a change magnitude in the open-circuit voltage upon the pausing.

18. The detecting method according to claim 17, wherein on the basis of the shift time to the charging at the constant voltage $V_{max}$ from the charging at the constant current value $I_0$, with respect to an increase rate $\Delta V_{cc}/\Delta t$ per a time (t) in a battery voltage $V_{cc}$ (in the constant current charging mode) at a $t_{cc}$ time earlier stage before said shift time, said increase rate $\Delta V_{cc}/\Delta t$ of the inspective rechargeable battery is compared with that of the normal rechargeable battery;

(v) when said increase rate of the inspective rechargeable battery is greater than that of the normal rechargeable battery, the inspective rechargeable battery is judged to have an increased internal resistance or a decreased electricity storable capacity or an increased internal resistance and a decreased electricity storable capacity; and (vi) when said increase rate of the inspective rechargeable battery is smaller than that of the normal rechargeable battery, the inspective rechargeable battery is judged to have a decreased internal resistance or to be short-circuited.

19. The detecting method according to claim 1, wherein said given current $I_M$ is in a range of $0.4\times I_0 \leq I_M \leq 0.6\times I_0$ with respect to the current value $I_0$ upon the constant current charging.

20. The detecting method according to claim 1, wherein said given current $I_M$ is ½ of the current value $I_0$ upon the constant current charging, i.e., $I_M=0.5\times I_0$.

21. The detecting method according to claim 2, wherein the inspective rechargeable battery has an electricity storable capacity of D time that the normal rechargeable battery, when with respect to the inspective rechargeable battery, a stored electricity quantity at the shift time to the constant voltage charging at the constant voltage $V_{max}$ from the constant current charging at the constant current value $I_0$ is $Q_0'$ and a period of time until reaching the given current value $I_M$ since said shift time is $t_M'$, and with respect to the normal rechargeable battery, aforesaid stored electricity quantity is $Q_0$ and aforesaid time is $t_M$;

$Q_0''(Q_0''=Q_0'/D)$ which is obtained from the following relation equation (2);

$$Q_0''=Q_0-I_0\times(t_M'/D-t_M) \quad (2)$$

and when from a relation formula Voc(Q) between the stored electricity quantity Q and an open-circuit voltage Voc of the normal rechargeable battery and also from a relation formula $R_{I0}(Q)$ between an internal resistance $R_{I0}$ of the normal rechargeable battery in the constant current charging mode at the constant current $I_0$ and said stored electricity quantity Q, the open-circuit voltage and the internal resistance of the normal rechargeable battery when the stored electricity quantity of the inspective rechargeable battery is $Q_0''$ are respectively Voc($Q_0''$) and $R_{I0}(Q_0'')$, and if the internal resistance of the inspective rechargeable battery with the stored electricity quantity $Q_0''$ is $R_{I0}''(Q_0'')$;

from the following relation equation (3), internal information relating to the internal resistance of the inspective rechargeable battery is detected:

$$R_{I0}'(Q_0'')/R_{I0}(Q_0'')=\{V_{max}-Voc(Q_0'')\}/\{I_0(Q_0'')\times R_{I0}(Q_0'')\} \quad (3).$$

22. The detecting method according to claim 21, wherein said relation formula Voc(Q) and said relation formula $R_{I0}(Q)$ of the normal rechargeable battery are selected from previously measured data of the normal rechargeable battery, relation equations obtained from said data, and relation equations obtained based on said measured data by way of simulation by means of a computer.

23. The detecting method according to claim 22, wherein said measured data are averaged data obtained by averaging measured data obtained from a plurality of normal rechargeable batteries which are the same in terms of the type and the kind.

24. The detecting method according to claim 14, wherein after the electricity storable capacity of the inspective rechargeable battery is judged to be D time that of the normal rechargeable battery, presuming that from a correction coefficient f(i, T) which is decided by the electricity storable capacity $C_N$, the discharge current i and the temperature T of the normal rechargeable battery, a total discharged electricity quantity $C_d$ of the normal rechargeable battery can be expressed by $C_d=C_N \times f(i, T)$ and a total discharged electricity quantity $C_d'$ of the inspective rechargeable battery is expressed to be $C_d'=D \times C_N \times f(i, T)$, when for an instrument in which the inspective rechargeable battery is used as a power source, an average consumption current of the instrument is made to be i, an average consumption power of the instrument is made to be p, and an average battery voltage of the inspective rechargeable battery is made to be Vm, a remaining actuation duration h of the instrument is computed in accordance with the equation $h=(D \times C_d)/i$ or $h=(Vm \times D \times C_d)/p$.

25. The detecting method according to claim 21, wherein presuming that from a correction coefficient f(i, T) which is decided by the electricity storable capacity $C_N$, the discharge current i and the temperature T of the normal rechargeable battery and also from a correction coefficient r which is proportional to $R_{I0}'(Q_0')/R_{I0}(Q_0')$ as the internal information relating to the internal resistance which is obtained from the equation (3) defined in claim 21, a total discharged electricity quantity $C_d'$ of the inspective rechargeable is expressed to be $C_d'=(1/r) \times (D \times C_N) \times f(i, T)=(V_r) \times D \times C_d$, when for an instrument in which the inspective rechargeable battery is used as a power source, an average consumption current of the instrument is made to be i, an average consumption power of the instrument is made to be p, and an average battery voltage of the inspective rechargeable battery is made to be Vm, a remaining actuation duration h of the instrument is computed in accordance with the equation $h=(1/r) \times (D \times C_d)/i$ or $h=(1/r) \times (Vm \times D \times C_d)/p$, where $C_d=C_N \times f(i, T)$.

26. The detecting method according to claim 24 or 25, wherein in the correction coefficient f(i, T) which is decided by the charge current i and the temperature T, previously measured data obtained using the normal rechargeable battery, function equations obtained on the basis of said data, data or function equations with respect to the charge characteristics which are obtained by way of simulation by means of a computer are selectively used.

27. The detecting method according to claim 14, wherein when the D value of the inspective rechargeable battery is less than a given value, the inspective rechargeable battery is judged to be terminated with its lifetime.

28. The detecting method according to claim 1, wherein the rechargeable battery is a rechargeable lithium battery in which oxidation-reduction reaction of lithium is used.

29. A detecting apparatus for detecting internal information of an inspective rechargeable battery when said inspective rechargeable battery is charged by a constant current-constant voltage charging regime in that charging is commenced at a constant current value $I_0$ and after the battery voltage reaches a given voltage value $V_{max}$, the charging is performed at a constant voltage $V_{max}$ until the termination thereof, said detecting apparatus comprising at least a means for measuring a charge current value I when the inspective rechargeable battery is charged by the constant current-constant voltage charging regime; a means for measuring an elapse of time (t) from the time when a constant current charging mode at a constant current value $I_0$ is shifted to a constant voltage charging mode at a constant voltage $V_{max}$; and a means for obtaining a charged electricity quantity by said constant voltage charging mode.

30. The detecting apparatus according to claim 29, wherein said means for obtaining said charged electricity quantity comprises an arithmetic means for obtaining said charged electricity quantity by way of arithmetic operation.

31. The detecting apparatus according to claim 30, wherein said arithmetic means performs arithmetic operation using information of said charge current value I and/or said elapse of time (t).

32. The detecting apparatus according to claim 29 which further comprises a memory means.

33. The detecting apparatus according to claim 32, wherein said memory means has information of the characteristics of a normal rechargeable battery as a reference standard for said inspective rechargeable battery memorized therein.

34. A detecting apparatus for detecting internal information of an inspective rechargeable battery when said inspective rechargeable battery is charged by a constant current-constant voltage charging regime in that charging is commenced at a constant current value $I_0$ and after the battery voltage reaches a given voltage value $V_{max}$, the charging is performed at a constant voltage $V_{max}$, until the termination thereof, said detecting apparatus comprising at least a means for measuring a charge current value I when said inspective rechargeable battery is charged by the constant current-constant voltage charging regime; a means for measuring an elapse of time (t) from the time when a constant current charging mode at a constant current value $I_0$ is shifted to a constant voltage charging mode at a constant voltage $V_{max}$; a means for measuring a time ($t_M'$) when the charge current value in said constant voltage charging mode becomes a given current value $I_M$; a means for measuring a charged electricity quantity $Q_{cv}'$ in said constant voltage charging mode; a memory means in which an electricity storable capacity $C_N$ of a corresponding normal rechargeable battery as a reference standard for said inspective rechargeable battery and internal information of said normal rechargeable battery when said normal rechargeable battery is charged by the constant current-constant voltage charging regime are memorized, said internal information including a time ($t_M$) when the charge current value in the constant voltage charging mode becomes a given current value $I_M$ and a charged electricity quantity $Q_{cv}$ in the constant voltage charging mode; and an arithmetic means for computing an electricity storable capacity ($C_N'$) of the inspective rechargeable battery from said $C_N$, $t_M$ and $Q_{cv}$ of the normal rechargeable battery which are memorized in said memory means and said $t_M'$ and $Q_{cv}'$ detected from the inspective rechargeable battery.

35. A detecting apparatus for detecting internal information of an inspective rechargeable battery when said inspective rechargeable battery is charged by a constant current-constant voltage charging regime in that charging is commenced at a constant current value $I_0$ and after the battery voltage reaches a given voltage value $V_{max}$, the charging is performed at a constant voltage $V_{max}$ until the termination thereof, said detecting apparatus comprising at least a means for measuring a charge current value I when said inspective rechargeable battery is charged by the constant current-constant voltage charging regime; a means for measuring an elapse of time (t) from the time when a constant current charging mode at a constant current value $I_0$ is shifted to a constant voltage charging mode at a constant voltage $V_{max}$; a means for measuring a time ($t_M'$) when the charge current value in said constant voltage charging mode becomes a given current value $I_M$; a means for measuring a charged electricity quantity $Q_{cv}'$ in said constant voltage charging mode; a memory means in which an electricity storable capacity $C_N$ of a corresponding normal rechargeable battery as a reference standard for said inspective battery and internal information of said normal rechargeable battery when said normal rechargeable battery is charged by the constant current-constant voltage charging regime are memorized, said internal information including the time ($t_M$) when the charge current value in the constant voltage charging mode becomes a given current value $I_M$ and the charged electricity quantity $Q_{cv}$ in the constant voltage charging mode; and a memory means in which further internal information of the normal rechargeable battery is memorized, said further internal information including a relation formula $V_{oc}(Q)$ of the open-circuit voltage $V_{oc}$ to the stored electricity quantity Q and a relation formula $R_{I0}(Q)$ of the internal resistance $R_{I0}$ to the stored electricity quantity Q in the constant current charging mode at the constant current value $I_0$; and an arithmetic means for acquiring internal information concerning an electricity storable capacity and internal resistance of the inspective rechargeable battery from said measured information of the inspective rechargeable battery and said memorized information concerning the characteristics of the normal rechargeable battery.

36. The detecting apparatus according to claim 35, wherein said relationship Voc(Q) and said relationship $R_{I0}$(Q) of the normal rechargeable battery include data table or function formulas previously acquired using the normal rechargeable battery.

37. The detecting apparatus according to claim 29 which further comprises a means for outputting or indicating the information acquired from the measuring means and/or information concerning the acquired internal information of the inspective rechargeable battery.

38. A battery pack comprising one or more rechargeable battery units and which has a detecting apparatus defined in claim 29 added thereto.

39. The battery pack according to claim 38, wherein said battery pack has a communication means with an instrument in which said battery pack is used as the power source.

40. The battery pack according to claim 38, wherein said battery pack has a means for outputting or indicating the information acquired from the measuring means and/or information concerning the acquired internal information of the inspective rechargeable battery.

41. A machinery having a detecting apparatus defined in claim 29 added thereto.

42. The machinery according to claim 41, wherein said machinery is selected from the groups consisting of inspection equipments for inspecting a rechargeable battery whether the battery is good or defective, chargers for charging a rechargeable battery, portable instruments (including cellular phones, personal digital assistants, and portable type computers), and movable bodies (including bicycles, automobiles, ships, aircrafts, and space crafts).

43. The machinery according to claim 41, wherein said machinery has a means for outputting or indicating the information acquired from the measuring means and/or information concerning the acquired internal information of the inspective rechargeable battery.

44. A program for detecting internal information of a rechargeable battery, characterized in that said program has a detecting method defined in claim 1 accommodated therein.

45. A memory medium for detecting internal information of a rechargeable battery in which a program defined in claim 44 is stored.

* * * * *

UNITED STATES PATENT AND TRADEMARK OFFICE
CERTIFICATE OF CORRECTION

PATENT NO. : 6,683,440 B2
DATED : January 27, 2004
INVENTOR(S) : Kawakami et al.

It is certified that error appears in the above-identified patent and that said Letters Patent is hereby corrected as shown below:

Column 16,
Line 10, "$Q_0'=Q_0$" should read -- $Q_0''=Q_0$ --;
Line 42, "mode" should read -- made --.

Column 22,
Line 4, "$(=Q_0')$" should read $(= Q_0'')$ --;
Line 20, "$(=t_M')$." should read -- $(=t_M'')$. --; and
Line 44, "$(t_0-t_0''/D)$" should read -- $(t_0-t_0'/D)$ --.

Column 26,
Line 61, "$R_{10}(Q')$." should read -- $R_{10}(Q'')$. --.

Column 27,
Line 19, "$V_{10}(Q_0'$" should read -- $V_{10}(Q_0'')$ --;
Line 27, "$R_{10}''(Q_0'')$" should read -- $R_{10}'(Q_0'')$ --;
Line 35, "$R_{10}'(Q_0')$" should read -- $R_{10}'(Q_0'')$ --.
Line 38, "$-Voc(Q_0'))/I_0$" should read -- $Voc(Q_0'')\}/I_o$ --;
Line 43, "$R_{10}(Q_0')=$" should read -- $R_{10}(Q_0'')=$ --;
Line 43, "$R_{10}(Q_0')\}$" should read -- $R_{10}(Q_0'')\}$ --; and
Line 47, "$D=Q_0 I_0$" should read -- $D=Q_0 - I_0$ --.

Column 28,
Line 9, "$Q_0'$" should read -- $Q_0''$ --; and
Line 10, "$Q_0'$" should read -- $Q_0''$ --.

Column 29,
Line 37, "rechargeable." should read -- rechargeable battery. --.

Column 32,
Line 63, "rechargeable" should read -- rechargeable battery --.

Column 41,
Line 41, "batter" should read -- battery --; and

Column 42,
Line 9, "$Q_0'/D=Q_0'$" should read -- $Q_0'/D=Q_0''$ --; and
Line 30, "$/R_{10}(Q_0')=\{V_{max} - Voc(Q')\}$" should read -- $/R_{10}(Q_0'')=\{V_{max}-Voc(Q_0'')\}$ --.

UNITED STATES PATENT AND TRADEMARK OFFICE
CERTIFICATE OF CORRECTION

PATENT NO. : 6,683,440 B2
DATED : January 27, 2004
INVENTOR(S) : Kawakami et al.

It is certified that error appears in the above-identified patent and that said Letters Patent is hereby corrected as shown below:

<u>Column 43,</u>
Line 62, "To" should read -- To be --.

<u>Column 45,</u>
Lines 56 and 63, "have" should read -- have been --.

<u>Column 50,</u>
Line 36, "$Q_0$and" should read -- $Q_0$ and --; and
Line 38, "equation (2);" should read -- equation (2): --.

<u>Column 52,</u>
Line 29, "$V_{max}$," should read -- $V_{max}$ --.

<u>Column 53,</u>
Line 34, "table" should read -- tables --.

Signed and Sealed this

Second Day of August, 2005

JON W. DUDAS
*Director of the United States Patent and Trademark Office*